United States Patent [19]

Petrich et al.

[11] Patent Number: 4,517,512

[45] Date of Patent: May 14, 1985

[54] INTEGRATED CIRCUIT TEST APPARATUS TEST HEAD

[75] Inventors: Dennis M. Petrich, Minnetonka; Christopher G. Amick, Mahtomedi; Stanley L. Gruenenwald, Blaine, all of Minn.

[73] Assignee: Micro Component Technology, Inc., Shoreview, Minn.

[21] Appl. No.: 381,736

[22] Filed: May 24, 1982

[51] Int. Cl.³ .................. G01R 31/28; G01R 1/04; G01R 15/12

[52] U.S. Cl. .................. 324/73 R; 324/73 AT; 324/158 F; 361/415; 371/20

[58] Field of Search .......... 324/73 R, 73 AT, 73 PC, 324/158 P, 158 F, 72.5; 361/412–415; 371/20, 15

[56] References Cited

U.S. PATENT DOCUMENTS

| | | | |
|---|---|---|---|
| 3,824,462 | 7/1974 | Vinsani | 324/73 PC |
| 3,946,310 | 3/1976 | Saper et al. | 324/72.5 |
| 4,064,455 | 12/1977 | Hopkins et al. | 324/73 R X |
| 4,145,620 | 3/1979 | Dice | 324/73 PC X |
| 4,196,386 | 4/1980 | Phelps | 324/158 F X |
| 4,335,457 | 6/1982 | Early | 324/73 R X |
| 4,340,858 | 7/1982 | Malloy | 324/158 F X |
| 4,348,760 | 9/1982 | Rice et al. | 324/73 AT X |
| 4,354,268 | 10/1982 | Michel et al. | 324/73 R X |

Primary Examiner—Gerard R. Strecker
Attorney, Agent, or Firm—Lawrence M. Nawrocki

[57] ABSTRACT

An improved test system for performing DC and AC parametric and dynamic functional testing of multi-terminal integrated circuits is described. All of the circuitry for producing and responding to D.C. and high-integrity stimulus and response test signals is located within a Test Head module sized for use in close proximity of the device under test. A high-integrity bus in the Test Head interconnects the high-integrity producing and handling circuits, with inexpensive connectors and batch-fabricated printed circuit board techniques. A Controller provides digital test commands for energizing the test signal producing ciructs within the Test Head and for evaluating the test results. The control and measurement signals passing between the Controller and the Test Module require no special conductor implementation techniques. A unique detachable, modularized bussing scheme between the Controller and Test Head and within the Test Head enables the test system to be manufactured at minimum cost, while maximizing reliability, signal integrity and manufacturing repeatability from system to system and enables rapid replacement and interchangability of test circuits and functional capabilities without sacrificing the quality of bus structure that carries the high integrity signals.

43 Claims, 12 Drawing Figures

INTEGRATED CIRCUIT TEST APPARATUS TEST HEAD

TECHNICAL FIELD

This invention relates generally to automated testing apparatus for semiconductors, and more particularly to a digital integrated circuit tester operable under microprocessor control for performing AC and DC parametric measurements and dynamic functional tests in a production environment.

BACKGROUND OF THE PRIOR ART

The rapid growth and technological innovation in the semiconductor industry over the last several years has created a severe demand for testers capable of rapidly and accurately testing and evaluating the operation of semiconductor. components. The demand has been particularly acute in the testing of state-of-the-art integrated circuits, where the functional complexity and component density on such chips have grown to dimensions thought to be impossible only a few years ago.

The demand for reliable, accurate, flexible, speedy and cost effective testing of integrated circuits exists throughout the entire semiconductor industry, and exists at all levels of the design and development, manufacture, and use of such circuits in the industry. The designer requires accurate integrated circuit test equipment to evaluate his new innovations and changes made to existing circuitry. The manufacturer requires accurate, repeatably, reliable and efficient test equipment to evaluate his integrated circuits at various stages of production, both in an unpackaged (i.e. "wafer") form as well as in the finally packaged form. The integrated circuit user requires test equipment that has the flexibility to rapidly adapt to the testing of a number of different integrated circuits, yet one that is cost effective, for evaluating, selecting and sorting the integrated circuits he receives from his suppliers and for analyzing integrated circuits that are damaged, degrade or otherwise malfunction in the particular structure or environment in which the circuits are used.

A number of different types of integrated circuit testers currently exist, which are for the most part, individually designed to accommodate the demands of a specific user. For example, very expensive test systems are available for integrated circuit manufacturers, who can justify the expense of the testing apparatus in their large-scale production facilities. On the other hand, an end user of the integrated circuit, who may use a large number of different types of such circuits, with a relatively low volume of each, has been forced to accept less expensive test equipment having significantly reduced test capability, as comared to that used by the large manufacturer. In general, an integrated circuit test apparatus universally acceptable for the demands of a designer, a manufacturer and an end user, does not presently exist in the art.

The basic function of an integrated circuit test system is to provide a test "stimulus" to the circuit being tested, and to determine or measure the "response" of that circuit to the stimulus. Such "stimulus/response" testing of integrated circuits basically takes three forms: that of DC (direct current) parametric testing; that of AC (alternating current) parametric testing; and that of functional or dynamic functional testing. A separate set of problems and considerations are present for each of the basic types of parametric and functional testing.

With regard to DC parametric testing, the stimulus/-response functions that are involved operate over a broad dynamic signal range, but at relatively slow speeds (i.e. such testing is typically not speed-sensitive). The primary problems that have been associated with DC parametric testing have related to the transmission of the DC parametric signals themselves, and involve such factors as line losses, extraneous signal pickup and ground and temperature differentials. Also, simultaneous, parallel DC testing has not generally been available.

With respect to AC parametric testing, the stimulus/-response functions that are involved operate across a relatively narrow dynamic range, and at high speeds. The primary problems that have been associated with AC parametric testing have involved the transmission of such signals over any appreciable distance, and include such factors as line loading and impedance effects and difficulty in minimizing skew (i.e. non-simultaniety of signals due to minute differences in signal path delays).

As integrated circuit complexity and component density have increased, so have the requirements for testing such circuits. State-of-the-art integrated circuit testers now typically test the integrated circuits under computer of microprocessor control. In such processor-controlled testing apparatus the circuitry for generating the "high integrity" test signals required for performing the DC and AC parametric testing, have generally been physically located at a position significantly remote from the actual integrated circuit being tested (referred to as the "device under test"). Typically, the DC and AC parametric signal generating circuitry is physically located in the same large console as the computer or processor which directs the testing procedures. Such testers generally use a relatively few number of circuits for generating the "high integrity" DC and AC parametric signals and "share" those circuits when testing an integrated circuit, by multiplexing the high integrity test stimuli among the plurality of pins to be tested, all under computer or microprocessor control. Due to the multiplexing nature of such test systems, they generally do not lend themselves to the simultaneous testing of multiple pins of an integrated circuit, particularly with regard to multiple pin testing of analog stimulus/response functions.

Such integrated circuit testers as described in the preceeding paragraph which have their high integrity signal producing circuitry located at a position remote from the device under test, are extremely difficult to manufacture, and are plagued by a number of problems in transmission of the high integrity signal stimulus and the response thereto, to and from the device under test. The length of cables over which such high integrity signals must pass in traveling from the remotely located console, to the situs of the device under test, significantly amplifies the previously described signal transmission problems such as line losses, extraneous signal pickup, ground and temperature differentials, line loading and impedance effects and skew minimization. In attempts to minimize the signal transmission problems, tester manufacturers use expensive end connectors and cabling and have resorted to the use of expensive materials for such cabling to reduce detrimental temperature and thermo-electric effects of the cables. Such manufacturers have typically used bulky and expensive coaxial cables and connectors for each conductor carrying a high integrity signal. Besides being expensive, such cables are difficult to work with and require considerable space and care in their use and maintenance. The manufacturers of such testers have also been required to hand-trim and accurately match large numbers of lines (conductors/cables), between the remotely located circuitry and the device under test, in an attempt to minimize skew distortion. Further, due to the length of cable over which a high integrity signal is required to travel during a testing operation, additional signal amplification and restoring circuitry often becomes necessary to restore the high integrity signals as close as possible to their initial conditions. Each time a high integrity signal of such test systems is acted upon or modified by such restoring or filtering circuitry, the probability of introducing inaccuracies into the signal (i.e diminishing its integrity) significantly increases, thereby reducing the overall effectiveness, accuracy and test repeatability of the entire test system.

The present invention overcomes most of the above-mentioned shortcomings of prior art integrated circuit test systems, and is suitable for use in testing integrated circuits either in their "wafer" or packaged "chip" form. The integrated circuit tester apparatus of the present invention provides flexibility of use for all phases of the semiconductor industry (i.e designers, manufacturers and end users). The test apparatus of the present invention retains the complex test programing capabilities offered by computerized testing, while practically eliminating the problems heretofore associated with the transmission and handling of high integrity test signals during the testing operation. The present invention enables the manufacturer of integrated circuit testers to use conventional, readily available and relative inexpensive connector and circuit board technology in the manufacture of the integrated circuit tester, in a manner that significantly reduces the cost of the testing apparatus and provides repeatability of signal integrity not only during a particular test sequence, but from tester to tester. The present invention generates and uses high integrity DC and AC parametric signals "at" the integrated circuit test site itself, thus minimizing signal transmission problems that have heretofore hampered integrated circuit tester apparatus, providing significantly improved performance in each of the areas of accuracy, line leakage, line losses, line impedence miss-match, crosstalk, noise rejection and skew.

BRIEF DESCRIPTION OF THE DRAWING

Referring to the Drawing, wherein like numerals represent like parts throughout the several views.

SUMMARY OF THE INVENTION

Figure 1:
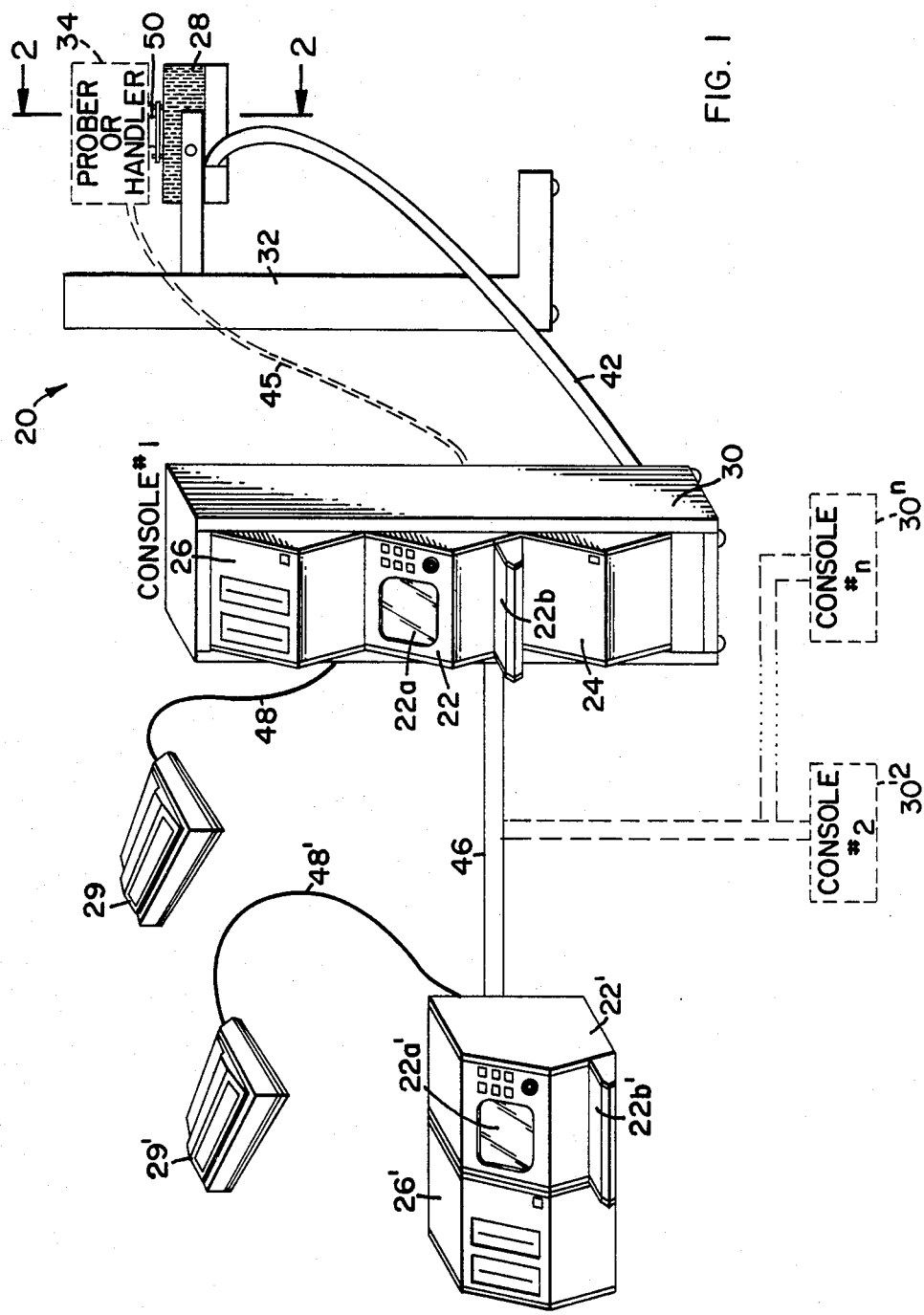
FIG. 1 is a pictorial representation of an integrated circuit Test System constructed according to and employing the principles of this invention.

The invention comprises a novel method of constructing and an automated test system for testing integrated circuits, whether in packaged "chip" form or in unpackaged "wafer" form. The invention incorporates novel architectural circuit, bussing and system layout that provides for ease of manufacture of the system and results in an accurate, use-flexible and cost-effective system usable by test disciplines spanning the entire integrated circuit industry.

The test system of this invention is particularly attractive for performing simultaneous/parallel DC parametric testing of integrated circuit pins and for performing AC parametric and dynamic functional testing above 200 megahertz. AC and dynamic functional test signals above this transmission frequency are particularly susceptible to deformation and deterioration when transmitted over any appreciable distance. For ease of reference herein, such "test" signals (whether they are of the "stimulus" or "response" type), will be referred to as "high-integrity" signals.

This invention enables placement of all DC parametric test circuits and all of that circuitry required for producing or directly evaluating high-integrity test signals, in a Test Head Module located in close proximity to the actual Device Under Test. The DC and high-integrity signal producing and handling circuitry is controlled and monitored by digital computer or microprocessor circuitry of a Controller, which may conveniently be located in a Module at a position remote from the Test Head Module or within the Test Head Module itself. Such Controller may also include the primary Power Supply sources as well as the Programming and Data Storage facilities of the test system. All communication between the Controller and the Test Head Module circuitry, can be readily performed by use of simple and relatively inexpensive wiring techniques since such "control", "power" and "measurement result" signals being transmitted therebetween are digital or of a type not particularly sensitive to degradation as a result of the distance over which such signals are required to travel.

The architectural circuit and interconnecting bus layout configurations of this invention enable all high-integrity signal producing and handling circuitry to be placed within the Test Head Module, which is positioned in direct proximity with the Device to be tested. Circuit and connector means within the Test Head Module define a plurality of interconnecting "buses", which transmit control, measurement and power signals as well as high-integrity test signals within the Test Head Module in a manner that maintains the integrity of the high-integrity test signals without requiring signal restoring circuitry or expensive coaxial cabling or hand-wiring of signal flow paths in the high-integrity bus. A Stack Bus is connected to, and provides a communication path between, the test circuits within the Test Head Module and the digital control and power circuits within the Controller.

According to one embodiment of the invention, a plurality of Pin Electronics Cards containing DC parametric Precision Measurement and AC and functional dynamic high-integrity signal producing circuitry "dedicated" to a particular pin of the device to be tested, are radially oriented within the Test Head Module, and have output terminals positioned to address in very close proximity, the Device Under Test. A Ring Bus provides for a rapid communication path between the Pin Electronics Cards and the Stack Bus. One or more auxiliary functional circuit boards containing high-integrity signal producing and handling circuitry "common" to the testing of a plurality of the pins of the Device Under Test, are interconnected with the Pin Electronics Cards by means of a High-Integrity Bus. The High-Integrity Bus extends between the circuitry which produces or responds to the high-integrity signals and the Pin Electronics Cards, and minimizes deterioration of the high-integrity signals passing therealong. The High-Integrity Bus is constructed in part from rapidly detachable connector pairs that enable a rapid interchangeability and replacement of the circuit boards of the Test Head, without degradation of the High-Integrity Bus or signals carried thereby.

The signal flow path distance over which high-integrity signals generated within the Test Head Module must pass between the signal producing or monitoring circuit and the test pin of the Device Under Test, is preferably less than five feet, and more preferrably less than three feet. No coaxial cable conductors or connectors are required for transmitting such high-integrity signals. The entire volume of the Test Head Module is preferably less than 3.5 cubic feet, providing ease of use for production or designer testing of packaged "chips" or unpackaged "wafers".

According to a preferred construction of the invention, the high-integrity producing signal circuitry within the Test Head Module includes circuit means for producing DC parametric test signals, AC parametric test signals and dynamic functional test signals. All such circuitry is responsive to digital test command signals received from a Controller. In a preferred construction of the invention, the test control signals are generated by a Central Processor contained within the Controller. The invention applies to the incorporation of any one or all three of the above testing capabilities within the Test Head Module, and to any other test functions that may be desired or arise in state-of-the-art testing of integrated circuit or circuit modules.

While the present invention will be described with respect to a preferred embodiment architectural construction, and as employing certain types of parametric and functional testing operations, it will be understood that the invention applies equally well to other forms of test functions and circuits. While the invention will be described in terms of a preferred physical number and arrangement of the dedicated Pin Electronics Cards and their associated auxiliary circuit boards for carrying the "common" circuitry, it will be understood that other configurations and number and functional types of circuit boards can equally well apply to the invention. Further, while a particular arrangement of interconnecting connectors will be illustrated for forming in large part the various "buses" of the invention, it will be understood that other equally acceptable connector arrangements can be envisioned as falling within the scope of this invention. Further, while a particular type of mating connector (i.e. male/female) will be described as applicable to the preferred construction of various buses of the invention, it will be understood that other types of connectors or signal flow path establishing means for forming in part the High-Integrity Bus, can be used. These variations and additional variations which are described throughout the specification, and other variations which can be configured by those skilled in the art, are all included within the broad scope of this invention, as limited only by the scope of the appended claims.

DETAILED DESCRIPTION OF THE INVENTION

Referring to the Figures, there is generally pictorially illustrated in FIG. 1, an integrated circuit test system 20, constructed according to the principles of this invention. The test system 20 employs a unique "architectural" circuit packaging arrangement which places all of the "stimulus/response" parametric and dynamic functional testing circuitry of the test system as close as possible to the circuit being tested, and eliminates all "wires" and "cables" from the "high integrity" signal paths between the stimulus/response circuitry and the circuit being tested. The benefits obtained by such novel architectural arrangement are extreme ease of manufacturing of the test system, excellent repeatability of signal characteristics from test system to test system and minimization of signal distortion due to signal transmission within the test circuitry itself, typically caused by leakage, line losses, impedance mismatch, crosstalk and noise injection.

Referring to FIG. 1, the test system 20 is of modular construction. The test system 20 is in the preferred embodiment, a microprocessor-controlled digital logic tester capable of performing DC parametric, dynamic functional, and AC parametric tests on integrated circuits having up to 64 input/output pins or terminals (or in the case of a water, up to 64 input/output pads). In the preferred embodiment, there are four modules comprising a single test system including a Controller Module 22, a Power Module 24, a Disk Module 26 and a Test Head Module 28. In the preferred embodiment illustrated in FIG. 1, the Controller, Power and Disk Modules are illustrated as operatively stacked within a vertical cabinet 30 and are labeled as Console #1. The test system has expansion capability for a number of such stacked modular Consoles, for servicing a single Test Head Module 28, as illustrated at $30^2$ through $30^n$ in FIG. 1. It will be understood that while the Controller, Power and Disk Modules have been illustrated as vertically stacked in the preferred embodiment construction of the test system, such modules are also readily adaptable for bench or table-type use. In the embodiment of the invention illustrated in FIG. 1, the Test Head Module 28 is illustrated as mounted to a manipulator test base, generally designated at 32, which provides for ease in interfacing the Test Head Module with a wafer prober or device handler, as hereinafter described in more detail. It will be understood that the Test Head Module 28 could equally well be simply placed on a bench or other suitable mounting surface or structure, as desired or required by the particular test function being performed, or by the application to which the test system is being applied. It will also be understood that all of the modules, with proper miniaturization could be placed in a single chassis or Test Head Unit as the test station itself which is preferably 3.5 cubic feet or less in volume.

The Controller Module 22 may have a number of peripheral input/output circuits or devices associated with it, such as a Printer, generally designated at 29 in FIG. 1. Similarly, the Controller Module 22 has an expansion capability for communicating with additional Controller and Disk Modules (respectively illustrated at 22' and 26' in FIG. 1), which may share the single Power Module 24. Such expansion Controllers 22' may have associated therewith their own input/output devices such as the Printer 29' illustrated in FIG. 1.

The Controller Module 22 will generally include a cathode ray tube (CRT) display 22a as well as a keyboard 22b which is preferably operably detachable from the Controller Module 22. Expansion Controller Unit 22' will generally have similar CRT and keyboard units 22a' and 22b' respectively.

Figure 5:
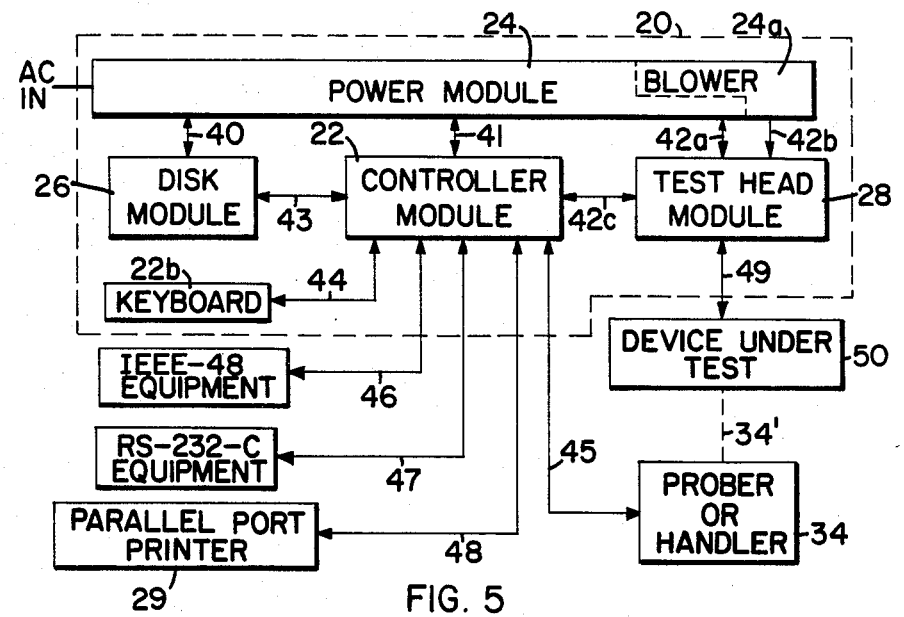
FIG. 5 is a functional block diagram illustrating the primary functional modules of the Test System pictorially illustrated in FIG. 1.

The operative or functional relationship between the modular components comprising the test system 20 is illustrated in block diagram form in FIG. 5. Referring thereto, the Power Module 24 provides power to the system in response to a received AC input power signal. The Power Module 24 provides both AC and DC power signals for the various components throughout the system, and includes a Blower 24a for cooling circuits within the Test Head Module 28, as hereinafter described. The Power Module 24 provides power to the Disk Module 26 by means of a signal flow path 40. It will be understood throughout this description that the terminology "signal flow path" merely represents a functional designation of the path that signals take between respective functional units. In practices, such signal flow paths may comprise one or a large number of actual conductors, wires, connectors or other signal transmission means suitable for carrying signals back and forth between the designated functional blocks.

The Power Module 24 is operatively connected to provide AC power to the Controller Module 22 by means of the signal flow path 41 and to receive control signals thereby from the Controller Module. The Power Module 24 provides DC power energization to the Test Head Module 28 by means of the signal flow path 42a, and provides cooling air from the blower 24a to the circuits of the Test Head Module 28 by means of a conduit generally designated at 42b. Referring to FIG. 1, the conduit 42b and the signal flow path 42a are generally designated at 42, and collectively comprise a casing 42b which carries directed air currents from the blower 24a as well as the wires comprising the signal flow path 42a.

The Disk and Controller Modules 26 and 22 respectively communicate with one another by means of a signal flow path 43. The Controller and Test Head Modules 22 and 28 respectively communicate with one another by means of the signal flow path 42c, which is also physically housed within the conduit generally designated at 42 in FIG. 1.

The Controller Module 22 communicates with its keyboard unit 22b by means of a signal flow path 44 and with a Prober or Handler 34 by means of a signal flow path 45. The Prober or Handler unit 34, not comprising a part of this invention, may be of any configuration well-known in the art, suitable for handling the particular integrated circuit or device being tested (designated in FIGS. 1 and 5, as the Device Under Test 50), so as to place the Device 50 into operative engagement with the output test pad configuration of the Test Head Module 28.

The Controller Module 22 is, in the preferred embodiment, of a type suitable for expanding its operative capability by connection to other complete Consoles ($30^2$–$30^n$) as well as to other Controller and Disk Modules (22', 26') by means of a standard expansion port generally referred to in the industry as an IEEE/488 Expansion Port. In FIGS. 1 and 5, the signal flow path leading from the IEEE/488 Expansion Port is generally designated at 46. The Controller Module of the preferred embodiment also has expansion capability for expansion through an output port generally referred to in the industry as an RS 232-C Serial Port. The signal flow path between the Controller Module 22 and such equipment connected to this output port is generally designated in FIG. 5 at 47. The Controller Module 22 also communicates with peripheral Printer equipment, as previously illustrated in FIG. 1, through a parallel port for such printers by means of a signal flow path 48.

The Test Head Module 28 directly communicates with the Device Under Test 50 by means of a signal flow path generally designated at 49, and described in some detail hereinafter. Referring to FIG. 5, the "mechanical" operative association between the Prober or Handler 34 and the Device Under Test 50 is illustrated by the dashed line 34' extending therebetween.

Figure 6:
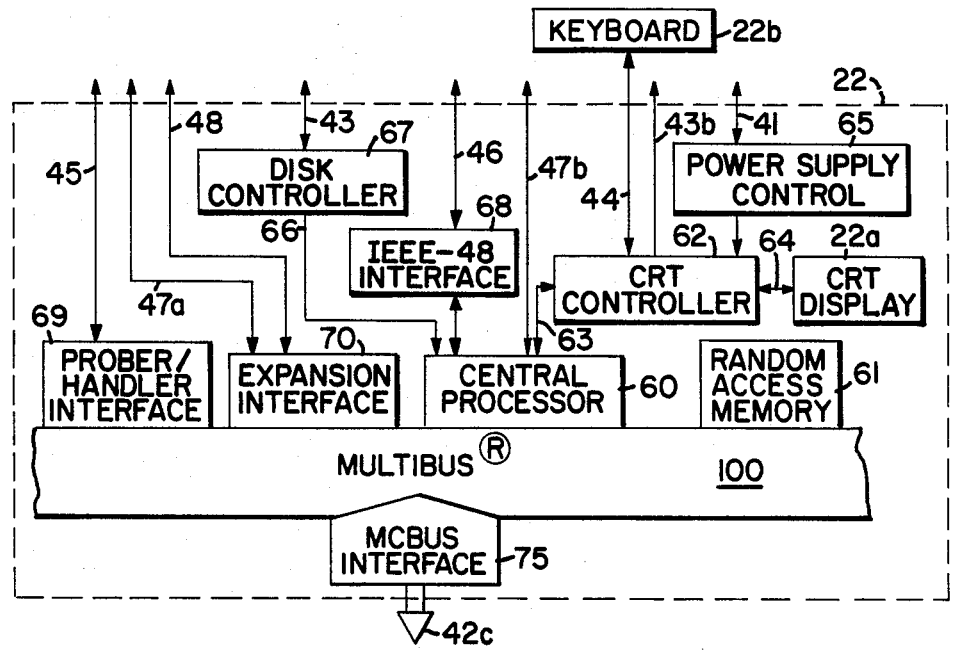
FIG. 6 is a block diagram representation illustrating the primary functional electrical networks of the Controller Module portion of the Test System of FIGS. 1 and 5.

As stated above, the Controller Module 22 comprises a computer-controlled module, which can be of any desired type or configuration. In a preferred configuration of the invention illustrated in the Drawing, the Controller Module 22 includes a microprocessor manufactured by Intel Corporation, having a Central Processor Unit (CPU) generally designated in the art as a Type 8612 Central Processor Unit, and designated in FIG. 6 as 60. Referring to FIG. 6, the Central Processor 60 has associated therewith 64K Bytes of Random Access Memory (RAM) 61, a cathode-ray tube (CRT) display 22a, a detachable keyboard 22b and interface networks for communicating with the Disk Unit and the Test Head. The Central Processor 60, the Random Access Memory 61 and other major elements of the Controller Module 22 communicate with one another by means of a high-speed communication path or bus 100 referred to under the trademark MULTIBUS ® (a registered trademark of Intel Corporation).

The Central Processor 60 communicates with a CRT Controller network 62 by means of a signal flow path 63. The CRT Controller network 62 communicates with the CRT Display by means of a signal flow path 64. The CRT Controller 26 receives power signals from a Power Supply Control network 65, which is directly connected to the signal flow path 41. The CRT Controller 62 also provides output control signals to the Disk Module 26 by means of the signal flow path 43b, and communicates with the Keyboard 22b by means of the signal flow path 44.

The Central Process 60 communicates by means of a signal flow path 66 to a Disk Controller network 67. The Disk Controller network 67 communicates with the Disk Module 26 by means of the signal flow path 43.

The Central Processor 60 communicates with an Interface network 68 for the IEEE-48 Expansion Port, which Interface circuit is directly connected to the signal flow path 46. The Multibus ® bus 100 directly communicates with the Prober Handler equipment 34 through the signal flow path 45 and an Interface network 69.

The Multibus ® bus 100 communicates through an Expansion Interface network 70 directly to the signal flow path 48 for the Printer equipment, and also through the Interface network 70 to one port of the RS 232-C Expansion Port by means of the signal flow path 47a. A second signal flow path 47b to the RS 232-C Serial Port is directly provided from the Central Processor 60.

An Interface network referred to in FIG. 6 as the MC Bus Interface network 75 provides direct communication through the signal flow path 42c from the Multibus ® bus 100 and the Test Head Module 28.

All commands for controlling the testing of the pins of the Device Under Test 50, originate at the Controller Module 22. All operator controls are located on the Controller Module 22. The Controller 22 receives AC power from the Power Module 24, and controls power application to all test system components according to operator inputs and various temperature sensors (not illustrated) located in the Controller Module 22, Power Module 24, and Test Head Module 28. The interface connection for the IEEE/488 and RS 232-C equipment allows the Test System 20 to be connected with existing tester configurations, and permits two or more Test Systems to be connected and controlled from a single Controller Module 22. The additional interface connections for the Prober/Handler and parallel port Printer provide additional testing and software development flexibility for complex testing procedures.

The Disk Module 26 satisfies the mass storage requirements of the Test System by providing, in the preferred embodiment, two flexible-disk drives having a total on-line capacity of two million bytes. Any appropriate Disk Modules or other memory storage facilities could be used.

The architectural design and circuit configurations within the Test Head Module 28 provide the previously mentioned principle benefits of using the Test System of this invention and the advantages over prior art integrated circuit Test Systems. The Test Head Module 28 is configured to contain all of the circuitry used for generating the DC and the "high integrity" test signals for the Device Under Test 50. Accordingly, the set of circuits required for generating all high integrity AC and DC parametric signals, is located within a matter of inches from the actual test site. Interconnection of circuitry within the Test Head Module 28 is accomplished with conventional, readily available connector and printed circuit board technology. No discrete hand-wired connections are required for the high-integrity signal lines, nor are any adjustments required to "tune" the electrical characteristics of interconnections, as is generally true with prior art Test Systems. The only circuit portion of the illustrated Test System 20 which is not immediately adjacent to the test site (i.e. within the Test Head Module 28), are the system's control processor/computer (i.e. Controller Module 22) and its associated peripheral devices, and the DC power supplies, located within the Power Module 24, which provide power to the Test Head Module 28, however, with proper miniaturization they could also be packaged within the Test Head Module 28.

By designing the "high-integrity" signal generation circuitry into the Test Head Module 28, most of the problem areas associated with the generation of high-integrity testing signals due to transmission over lengthy cables and lines, are entirely avoided or minimized. With the present invention, the only electrical signals that pass between the Test Head Module 28 and the remotely located Controller Module 22 are power signals, digital test control information signals (i.e. addressing the software instructions), and test results from the test measurements. These digital and power signals are transmitted over conventional parallel data communication paths, which are much less susceptible to those types of error contributors which affect the high-integrity stimulus/response signals.

The Test Head Module 28 is configured to place "all of that DC circuitry and most of the AC circuitry required for providing "stimulus/response" testing of any particluar pin of the Device Under Test 50, on a "single" assembly, referred to as the Pin Electronics Card (hereinafter described in more detail). One such Pin Electronics Card is present for each "pin" of the Device Under Test 50 that is to be tested. In other words, the Test Head Module 28 need only have as many of the Pin Electronics Cards as there are actual pins, or terminals or pads, that are to be tested on the Device Under Test 50.

Figure 2:
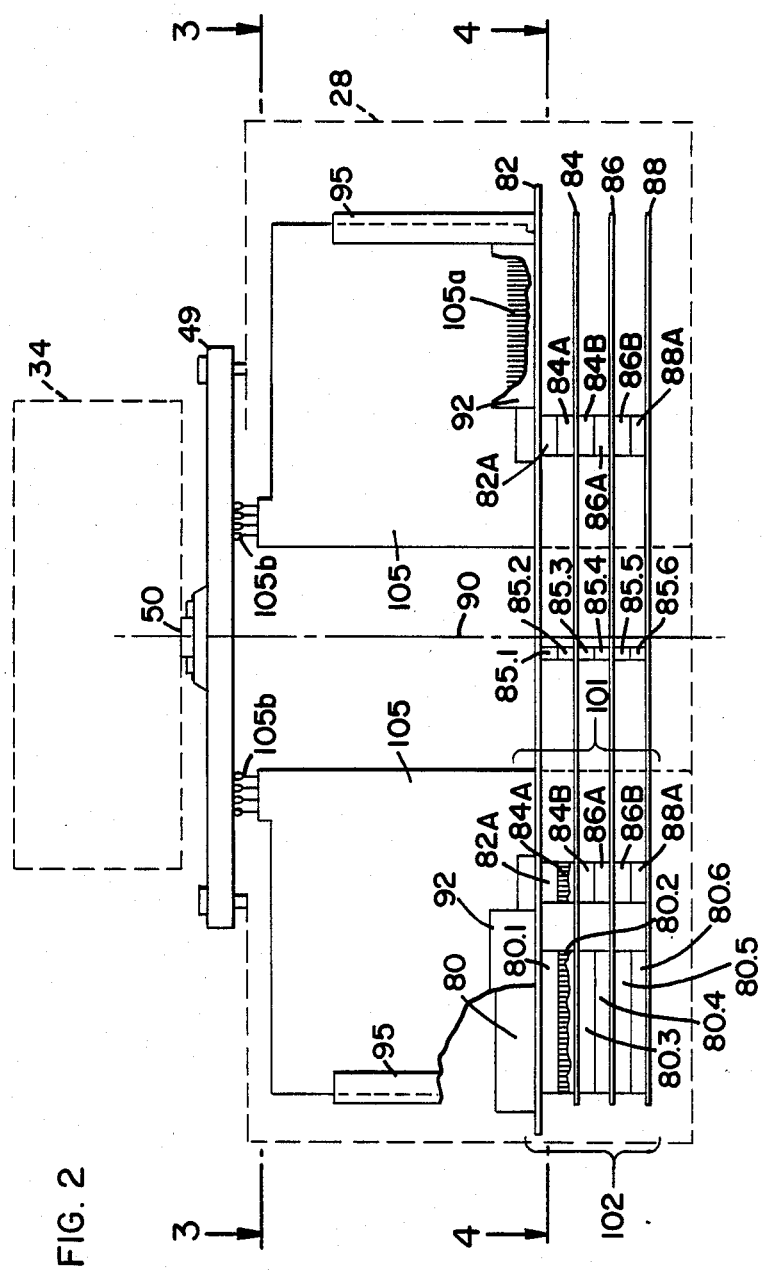
FIG. 2 is a cross-sectional diagrammatic view of the Test Unit Module portion of the integrated circuit Test System, as generally viewed along the Line 2—2 of FIG. 1.
Figure 3:
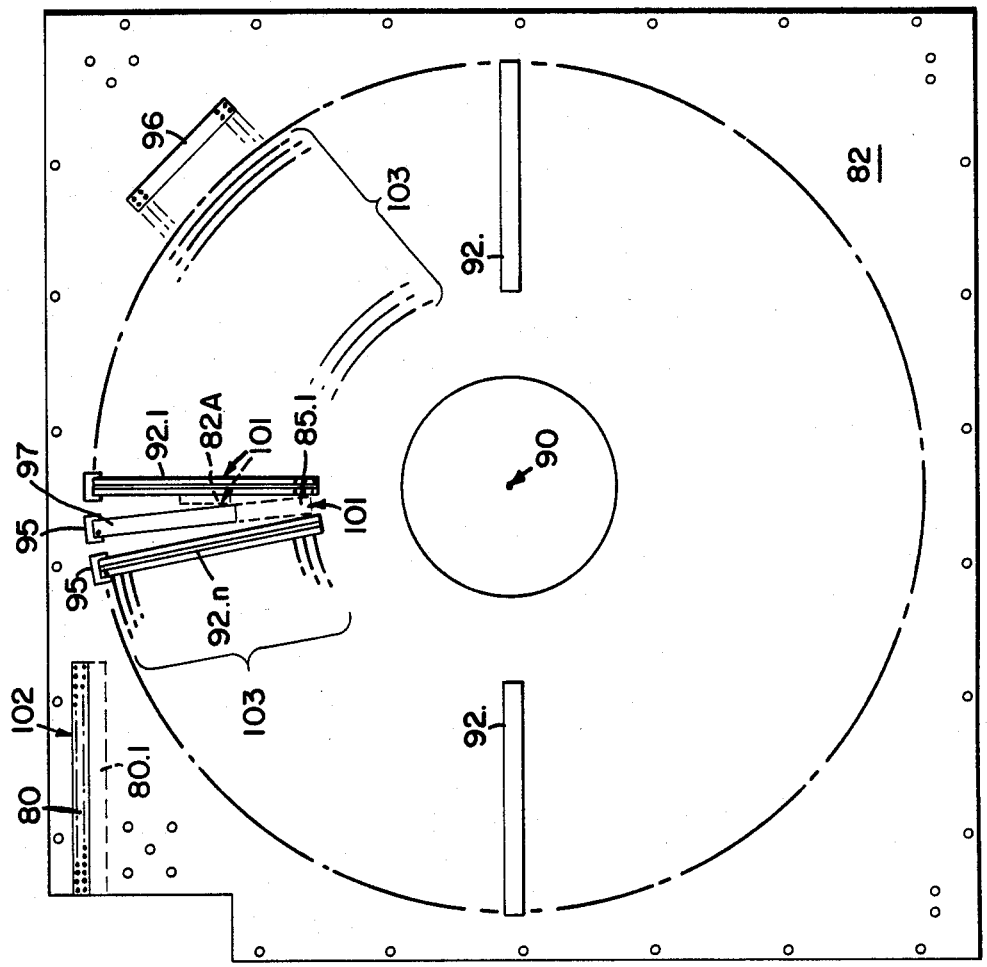
FIG. 3 is a view generally taken along the Line 3—3 of the Test Unit Module of FIG. 2 with Pin Electronics Cards removed.
Figure 4:
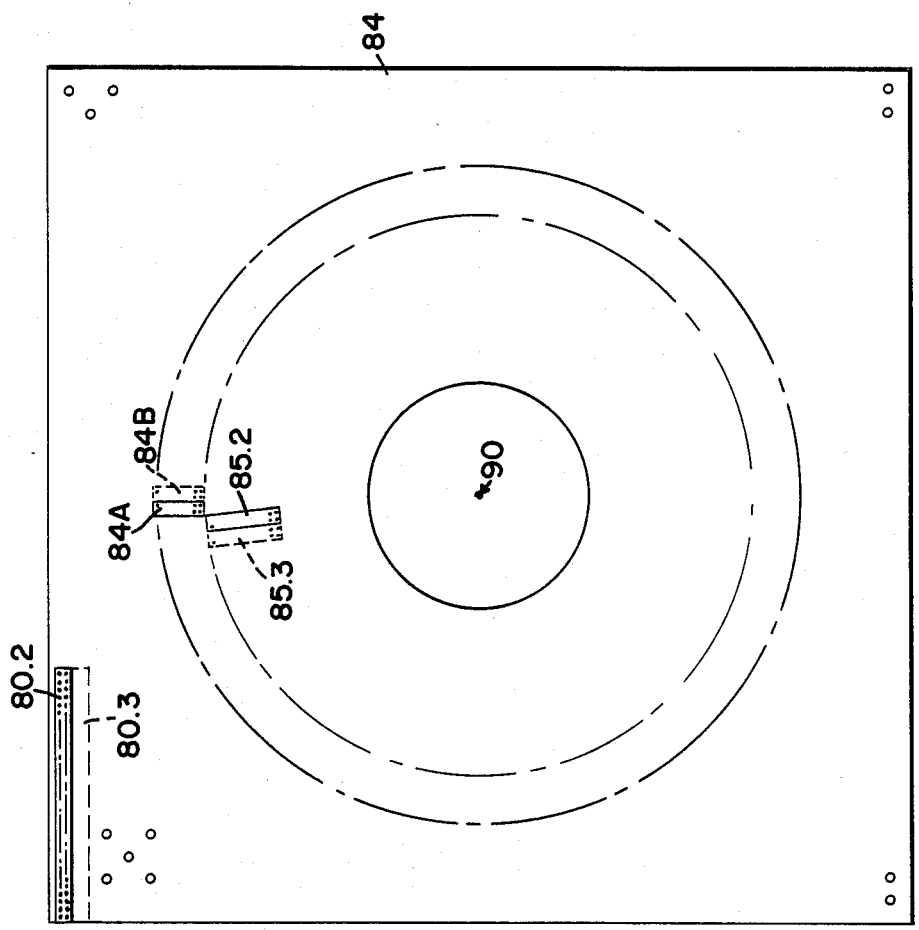
FIG. 4 is a view generally taken along the Line 4—4 of the Test Unit Module of FIG. 2.

The architectural layout of the circuits within the Test Head Module 28 is illustrated in more detail in FIGS. 2 through 4. The operative interrelationship of various functional portions of the circuitry within the Test Head Module 28 and the Controller Module 22 is diagrammatically illustrated in FIG. 7.

Referring to FIGS. 2 and 3, the signal flow path 42c from the MC Bus Interface network 75 of the Controller Module 22 provides a direct signal flow path from the Multibus bus 100 of the Controller Module 22 to a connector 80 on a laterally oriented printed circuit board 82, hereinafter referred to as the Mother Board. The signal flow path 42c, in the preferred embodiment, physically comprises a pair of multiple wire ribbon cables, suitable for carrying the control information and measurement results type of information back and forth between the Controller Module 22 and the circuits of the Test Head Module 28.

The Mother Board 82 (see FIG. 2) is the uppermost (in the pictured orientation) of a plurality of generally similarly sized printed circuit boards, referred to by the numerals 84, 86 and 88. The Mother Board 82 and those circuit boards 84, 86 88 underlying the Mother Board are, in the preferred embodiment, of generally rectangular configuration, measuring approximately 20 to 22 inches per side. The printed circuit boards 82, 84, 86 and 88, have in the preferred embodiment, a circular cutout of approximately 5 inches in diameter through their centers, and are stacked one above the other such that their respective cutout portions concentrically align with one another about a vertical axis 90 (see FIG. 2). The circular cutout facilitates flow of cooling air from the Blower 24a to and between the circuit board and facilitates visual viewing of the Device Under Test in wafer probing tests.

The Mother Board 82 has a plurality of male-type connectors 82A radially oriented about the vertical axis 90, and projecting downwardly from the lower surface of the Mother Board 82 (see FIGS. 2 and 3). In the preferred embodiment of the invention, there are 64 of such male-type connectors 82A radially aligned and spaced about the axis 90, corresponding to the maximum number of pins of a Device Under Test 50 that can be tested by the preferred embodiment tester. In the preferred embodiment, each of the connectors 82A is a 16-pin connector. However, it will be understood that connectors having any number of pins may be used.

The plurality of male connectors 82A identically align in mating engagement with a plurality of female connectors 84A, of like number, mounted on the upper surface of the printed circuit board 84 (see FIGS. 2 and 4). When the aligned mating connectors 82A and 84A are respectfully engaged (as illustrated in FIG. 2), they mechanically secure the printed circuit boards 82 and 84 to one another, and also provide high-integrity electrical connection paths through the mating male/female pin portions of the connectors, in the vertical direction.

In similar manner, the circuit board 84 has a plurality of male connectors 84B (illustratd in dashed lines, but understood to be directly below connectors 84A) radially arranged about the central axis 90 and vertically aligned with and forming a continuous extension of the corresponding female connectors 84A. Corresponding vertically aligned pins of the female connectors 84A and the male connectors 84B are electrically continuous with one another and provide respective signal flow communication paths vertically through the printed circuit board 84.

In similar fashion, the printed circuit board 86 has upper and lower female and male connectors 86A and 86B respectively, radially oriented about the axis 90 and vertically aligned with the respective connectors 82A, 84A and 84B. Similarly, the lower most circuit board 88 has a plurality of female connectors 88A radially and vertically aligned with the plurality of male connectors 86B, as illustrated in FIG. 2. FIG. 4 illustrates the connector pattern for both circuit boards 84 and 86, as well as for the upper connectors of the lowermost circuit board 88.

When operatively aligned and engaged, the plurality of connectors: 82A, 84A, 84B, 86A, 86B and 88A, collectively form a strong "mechanical" bond holding the Mother Board 82 and the underlying circuit boards 84, 86 and 88 in fixed alignment with one another, as illustrated in FIG. 2, and form a plurality of "high-integrity" electrical communication or signal flow paths" vertically through the mated connectors. In the preferred embodiment, each vertically aligned connector "set", forms sixteen individual conductor paths extending from the upper surface of the lowermost circuit board 88 to the lower surface (i.e. connector 82a) of the Mother Board 82. These electrical signal flow paths formed by the plurality of vertically aligned and mated connectors form a part of a signal flow path collectively referred to as the "High-Integrity Bus".

The High-Integrity Bus, for simplicity will be referred to by the numeral 101. While the Test Head Module 28 has been illustrated in the Drawing and described with respect to the preferred embodiment of the invention, as having a Mother Board 82 and the underlying circuit boards (84, 86 and 88), (to be described in more detail hereinafter), it will be understood that more or less of such underlying circuit boards could be used, and interconnected using the connector/bus concept above-described for forming the High-Integrity Bus 101. It will also be understood that while a male/female connector configuration has been illustrated, other connection schemes which provide the desired "high-integrity" electrical paths are included within this invention, and that the "electrical" and "mechanical" connections between the circuit boards may be separated from one another.

The Mother Board 82 and the underlying circuit boards 84, 86 and 88 are also interconnected by means of a plurality of male/female connectors in manner similar to that described with respect to the High-Integrity Bus 101, along one edge of the respective circuit board cards to form a Stack Bus 102, illustrated most clearly in FIG. 2. The uppermost connector of the Stack Bus 102, is, in the preferred embodiment, a 100 pin connector 80 on Mother Board 82, which receives a Mother Board Interface Card 98 (as shown diagrammatically in FIG. 7) connected to the ribbon cables 42c from the MC Bus Interface circuit 75 of the Controller Module 22 as hereinafter described. Referring to FIG. 2, a male-type connector 80.1 is mounted to the lower surface of the Mother Board 82 and is aligned with and forms an electrical continuum of the pin connections of connector 80. The pins of the male connector 80.1 cooperatively mate with terminals of a female-type connector 80.2 on the upper surface of the printed circuit board 84, the terminals of which are in turn connected through similar alternating male and female connectors 80.3, 80.4, and 80.6 as illustrated in FIG. 2, to form the Stack Bus 102.

In the embodiment of the invention illustrated, the Stack Bus 102 connectors comprise 100 pin connectors, providing 100 signal flow paths within the Stack Bus 102; however, it will be understood that any number of signal flow paths could be included within the Stack Bus. Further, while the Stack Bus 102 illustrated comprises a single stack of connectors, the functional bus 102 could be configured from a plurality of such stacks of connectors, either vertically aligned with one another, or could even be off-set from one another between various layers of the respective circuit boards. As will become apparent from a more detailed description of the invention, since the signals that flow through the signal flow path comprising the Stack Bus 102 are not high-integrity testing signals, the uniformity of signal flow path lengths of the various conductor paths forming the Stack Bus is not as critical as in the case of the High-Integrity Bus 101.

A third bus referred to as the Ring Bus 103 comprises a plurality of concentric conductor rings on the Mother Board 82 concentrically aligned about the axis 90 for interconnecting Pin Electronics Card 105 circuits, as hereinafter described. The conductors forming the Ring Bus 103 are preferably printed circuit conductors formed on the Mother Board 82, and interconnected with conductors of the Stack Bus and certain ones of the High-Integrity Bus. The Ring Bus 103 conductors are used primarily to carry various "common" signals such as Address Signals and voltage reference and power signals to the various Pin Electronics Cards to be hereinafter described. The number of such conductors forming the Ring Bus will vary depending upon the particular testing format, card addressing structure, and the like which is used in the particular test configuration. Thirty to sixty such conductors forming the Ring Bus 103 would not be uncommon.

Referring to FIGS. 2 and 3, a plurality of female-type printed circuit edge-type receptor connectors, generally designated at 92.1–92.n, are symmetrically radially arranged around the central axis 90 and are mounted to the upper surface of the Mother Board 82. These connectors are referred to in the preferred embodiment as Pin Card Connectors, and the last numeral of their respective reference numerals corresponds to their respective position as measured from Pin Card Connector 92.1 in a clockwise direction when looking at the Mother Board in plan view as in FIG. 3. In the preferred embodiment, the Pin Card Connectors 92 are 100 pin connectors; however any appropriate numbers of pins could be used. The number of such pin Card Connectors 92 will vary depending upon the number of pins of a Device Under Test 50 that can be tested by the Test System 20. In the preferred embodiment construction of the Test System 20, the System is capable of testing a Device 50 having up to 64 output pins, terminals or pads; therefore, there are 64 Pin Card Connectors for accommodating 64 Pin Cards. Each of the Pin Card Connectors 92.1–92.64 has associated therewith a card edge support holder 95 mounted to the Mother Board 82 or to its associated connector 92 and vertically upwardly projecting, to support the edge of a printed circuit card inserted within the respective Pin Card Connector 92 (see FIGS. 2 and 3). The terminals of the Pin Card Connectors 92 are selectively connected to conductors of the Ring Bus 103 and to conductors of the High-Integrity Bus 101 to provide signal paths therefrom to the Pin Electronics Card 105 held by the connector 92.

It will be understood, that while only two of the vertically aligned connector columns or stacks forming the High-Integrity Bus 101 are illustrated in FIG. 2, that there are a plurality of such connector stacks or columns radially arranged about the central axis 90, one each of such connector stacks or columns being present for use in association with one each of the Pin Card Connectors 92. Therefore, in the preferred embodiment of the construction of the invention, which is configured to accept 64 Pin Electronics Cards and Pin Card Connectors 92, there are a corresponding number (i.e., 64) connector columns such as 82A, 84A, 84B, 86A, 86B, 88A which collectively comprise the High-Integrity Bus 101. In addition, there is in the preferred embodiment, an additional connector column illustrated in (FIGS. 2, 3 and 4) by the connectors 85.1, 85.2, 85.3, 85.4, 85.5 and 85.6 which are vertically aligned with one another and are radially arranged with respect to the central axis 90, and matingly interconnect in manner identical to that previously described with respect to the connectors forming the other vertical connector stacks or columns of the High-Integrity Bus 101.

The connector column formed by connectors 85.1 through 85.6, extends from that printed circuit board 88 which carries the Functional Sequencing circuitry, and is used in the preferred embodiment for carrying High-Integrity functional addresses for the memory circuits located on the Pin Cards, hereinafter described. Accordingly, signals traveling through this connector column represent high-integrity signals which are included within the terminology High-Integrity Bus 101, as used in this description. In the preferred embodiment, the high-integrity signal carrying connector column 85.1–85.6 is formed by 30-pin connectors; however, it will be understood that connectors having any desired number of terminals could be used for this purpose. Further, it will be understood that while a specific arrangement of connector columns forming the referred to "High-Integrity Bus" 101 has been illustrated with respect to the preferred embodiment of the invention, any other arrangement or orientation of such connectors is included within the scope of this invention. The important property to be maintained in the construction of the interconnection paths comprising the High-Integrity Bus 101 is that the signal flow paths involved be constructed as short as possible and in a manner so as to maintain the integrity of the signal flow path in as uniform a manner as possible, so as to maintain the integrity of the signals passing therethrough, without requiring the use of coaxial conductor cables or wiring.

Referring to FIG. 3 there are two other connectors illustrated on the upper surface of the Mother Board 82, that do not directly form a portion of the various buses hereinbefore described. The first of such connectors, identified at 96 comprises in the preferred embodiment, a 60-pin female-type printed circuit card edge-type connector for accepting a printed circuit card upon which voltage "reference" information is generated. The terminals of the connector 96 are connected by wires (not illustrated) for energization by the Stack Bus 102 conductors and also electrically connected to the conductors of the Ring Bus 103. The output signals from the Voltage Reference circuitry (hereinafter described) which is held by the connector 96 is transmitted to the Pin Card Connectors 92 through the Ring Bus 103.

Another 60-pin female-type printed circuit card edge-type connector 97 is mounted to the upper surface of the Mother Board 82 and is radially aligned with the high-integrity conductor stack 85, as illustrated in FIG. 3. The connector 97 is, in the preferred embodiment, used to carry a printed circuit card that bears Auxiliary Power Supply Circuitry, which provides additional power requirements for testing the individual pins of the Device Under Test (hereinafter described). The terminals of the Auxiliary Power Supply connector 97 are connected for energization to the appropriate conductors of the Stack Bus 102 (not illustrated), and communicate with the various Pin Card Connectors 92 by means of the Ring Bus conductors 103.

Each of the Pin Card Connectors 92.1–92.64 is suitable for receiving a printed circuit card, referred to hereinafter as a Pin Electronics Card 105. Two such Pin Cards 105 are illustrated in FIG. 2 as they would appear when operatively connected to their respective Pin Card Connector 92 in radial alignment about the central axis 90. Each of the Pin Cards 105 has an edge-type connector, generally designated at 105a in FIG. 2, which matably engages the female connector terminals of the respective Pin Card Connector 92, for communication with the conductors of the Ring Bus 103 and the High-Integrity Bus 101.

As stated in the Background section of this specification, state-of-the-art integrated circuit testing systems require three basic types of circuitry to provide "stimulus" and to determine "response" to and from devices under test. The first basic type is DC parametric circuitry, that works with stimulus/response functions over a broad dynamic signal range, at relatively slow speeds. The Dynamic Functional and AC parametric circuitry, work with stimulus/response functions across a relatively narrow dynamic range, but at relatively higher speeds.

Within the Test Head Module 28 of the preferred embodiment of the invention disclosed in the Drawing, the AC and DC parametric circuitry is partitioned into two types of circuitry: (1) that type of circuitry required for each pin of the Device Under Test 50; and (2) that circuitry which is required for fully executing the required AC, functional and DC parametric tests, regardless of the number of pins on the Device 50 which are to be tested. That circuitry in the first-identified category (i.e. that "dedicated" to each pin of the Device Under Test 50), including AC, functional and DC driver and receiver circuitry, is physically located on that one of the Pin Electronics Cards 105 that is associated with that particular "pin" of the Device Under Test 50. Locating such "pin-required-circuitry" on the respective Pin Electronics Card 105 itself, minimizes the distance that high-integrity signals generated by such circuitry, must travel to reach the actual test site (i.e. the "pin" of the Device 50 which is being tested). At the same time that test signals are being generated and response signals are being received by the Pin Electronic Cards 105, the circuitry on the underlying Mother Board simultaneously permits intercommunication of control and reference signals to and from the Pin Electronics Cards 105, under control of the Central Processor 60 within the Controller Module 22. Further, the architectural arrangement provided by the Pin Electronics Cards 105 enables true and "simultaneous" measurements to be made on the plurality of Pins of the Device Under Test 50.

The "additional" or "common" test circuitry that is required regardless of the number of pins on the Device Under Test 50, will be referred to as the "Master" circuitry. Such Common or Master circuitry exists for the generation of AC and DC parametric and dynamic functional signals. Particularly with regard to AC parametric signals, it can be extremely important that the various signal flow paths or lines which interconnect the Master circuitry with the individual Pin Electronics Cards 105 all be nearly identical in characteristics. Accordingly, such Master Circuitry is, in the preferred construction of the invention, physically located as close as possible to the Mother Board 82 and the respective Pin Electronics Cards 105, (i.e. on the plurality of underlying circuit boards 84, 86 and 88, see FIG. 2). This arrangement permits the shortest possible signal paths from the Master circuitry to the Pin Electronics Cards, permits controllable symmetry and signal line characteristics, and the use of conventional circuit board interconnection technology without requiring discrete "cut and trim" wiring.

As previously stated, the acutal number of circuit boards which underly the Mother Board 82, and which contain the master test circuitry referred to above, can vary, depending upon the amount of and complexity of the required common test circuitry. In that embodiment of the invention illustrated in the Drawing (see FIG. 2), there are three such underlying boards, 84, 86 and 88. It will be noted that no actual circuitry is illustrated as appearing on the circuit boards 84, 86 and 88. It will be understood that from a description of how such circuitry is intended to be used within the architecture of this Test System 20, and by a general description of the functional characteristics and the block diagram interrelationships of such circuits (to be hereinafter described), that those skilled in the art can readily provide appropriate circuitry within the scope of this invention, to satisfy their particular testing requirements.

In the embodiment of the invention illustrated in FIG. 2, circuit board 84 contains the "timing" signals and pulse trains for the test functions, which timing signals and pulses are used for dynamic functional and AC parametric testing. Such timing signals from the "timing generator" circuit board 84 communicate directly with the Pin Electronics Cards 105 by means of the High-Integrity Bus 101.

The circuit board 86 contains in the preferred embodiment, common AC measurement circuitry. The circuit board 86 is referred to in the preferred embodiment as the AC measurement circuit board, and generally determines the time between the occurrence of two positive-going waveform edges, which are typically provided by precision AC comparators (hereinafter described in more detail) on each Pin Electronics Card 105. In the preferred embodiment, the AC measurement circuitry also provides inverters to allow either positive or negative-going pulse edges to be used for measurement purposes, and includes precision pulse generators for calibration purposes. The AC meausrement circuit card 86 communicates with the Pin Electronics Cards 105 directly through the High-Integrity Bus 101.

The third underlying printed circuit board 88 illustrated in FIG. 2, is referred to in the preferred embodiment as the Function Sequencer circuit board, and controls in the preferred embodiment, the application of test patterns to the Device Under Test 50 during dynamic functional testing. Each of the Pin Electronics Cards 105 contains a functional RAM (Random Access Memory). The Function Sequencer circuit board 88 is operative to store test patterns in the Pin Electronics Card RAM. Alternatively, such test patterns may be generated by the Pin Electronics Card circuits themselves in response to a static operand. The Function Sequencer circuit board electronics 88 communicates with circuitry of the Pin Electronics Card 105 directly by means of the High-Integrity Bus 101. As previously stated in description of the connector 85 comprising a portion of the High-Integrity Bus 101, the Function Sequencer circuit 88 communicates with the RAM memory of the Pin Electronics Cards 105 through the connector 85 portion of the High-Integrity Bus 101.

A fourth functional printed circuit board contemplated by the inventors as being readily applicable to inclusion within the Test Head Module 28 is a Data Address Algorithm Generator circuit board (identified at 99 in FIG. 7) which would be a special-purpose circuit network designed to speed testing of memories and other devices with redundant or pattern-sensitive logic. For flexibility of use, the volume of the Test Head 28 should preferably be less than 3.5 cubic feet.

Figure 7:
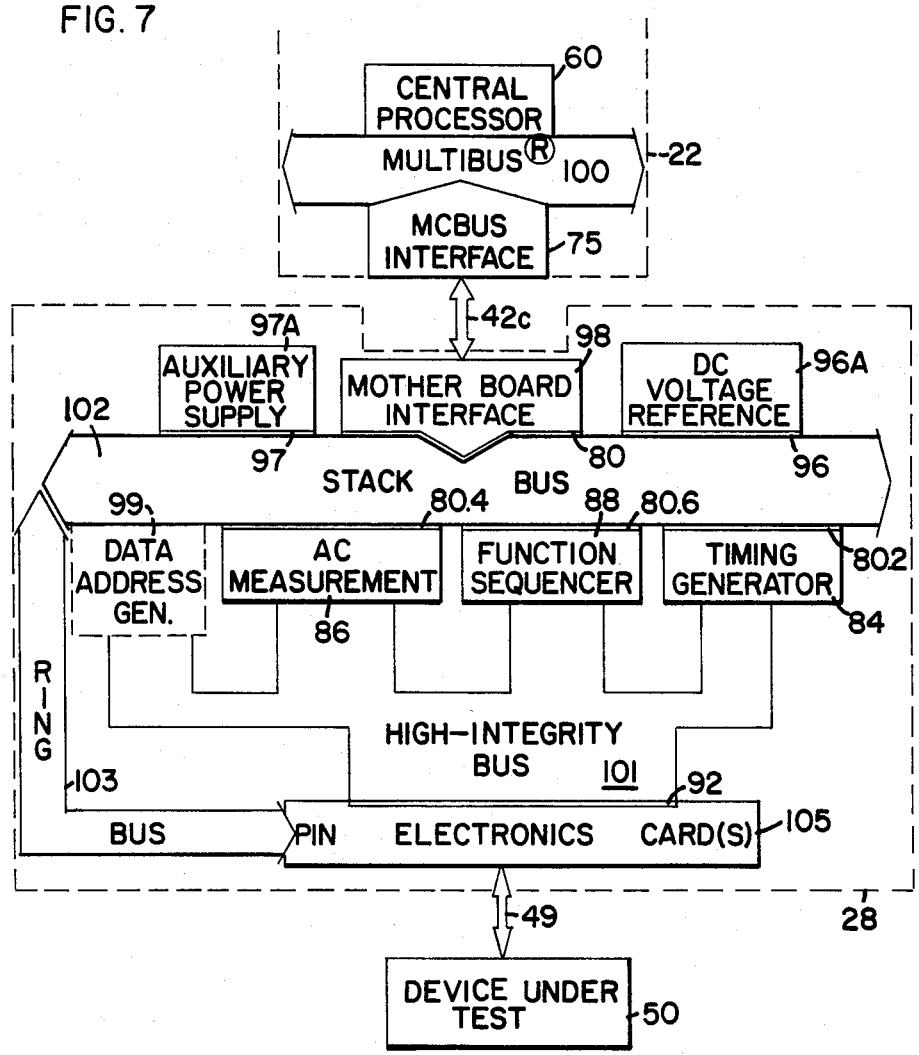
FIG. 7 is a block diagram representation illustrating the primary functional electrical networks within a typical construction of Test Head Module portion of the Test System of FIGS. 1 and 5, also illustrating the functional interrelationship of the networks and multiple buses of the Test System of this invention.

The interrelationship between the primary circuit networks within the Test Head Module 28 of the Test System 20 are illustrated in block diagram form in FIG. 7. Referring thereto, the Multibus ® bus 100, the Stack Bus 102, the Ring Bus 103 and the High-Integrity Bus 101 are illustrated as they relate to one another and to the various functional circuit blocks. The central processor 60 communicates by way of the Multibus bus 100 and through the MC Bus Interface network 75, the signal flow path 42c and the Mother Board Interface network 98 with the Stack Bus 102. The conductors of the pair of ribbon cables which comprises the signal flow path 42c are directly connected to circuitry on the Mother Board Interface network 98, which in turn is operatively inserted into the connector 80 on the Mother Board 82. An Auxiliary Power Supply network 97A communicates with the Stack Bus through the connector 97 and a DC Voltage Reference generating network 96A communicates with the Stack Bus 102 through the connector 96. The Auxiliary Power Supply printed circuit card 97A and the DC Voltage Reference generation circuit card 96A are carried by the Mother Board 82, as is apparent from FIG. 3.

The Ring Bus 103 operatively interconnects the Pin Electronics Cards 105 through their respective Pin Card Connectors 92. The Ring Bus 103 also is connected to directly communicate with the Stack Bus 102, for providing operative signal paths for relatively lower integrity signals such as voltage reference signals, power supply signals, addressing signals, software instruction signals and the like among the various functional blocks comprising the Test System.

The Timing Generator circuit board 84, the Function Sequencer circuit board 88, the AC Measurement circuit board 86 and the Data Address Generator circuit board 99 all directly communicate with one another and with the other functional circuits of the system through the Stack Bus 102, the Ring Bus 103 and the Multibus ® bus 100, but are also each connected through the High-Integrity Bus 101 for direct communication with the Pin Electronics Cards 105 whenever such communication involves high-integrity signals. The Pin Electronics Cards 105 communicate with the Device Under Test 50 by means of the signal flow path 49 as described more fully hereinafter.

The Controller Module 22 communicates with the Test Head Module 28 by transferring data and addresses from the MultiBus bus 100 through the MC Bus Interface 75 and the signal flow path 42c. The Mother Board Interface network 98 in the Test Head Module 28 buffers the signals received from the signal flow path 42c and makes them available to all elements connected to the Stack Bus 102 and the Ring Bus 103. Address signals received by the Mother Board Interface network 98 from the Controller Module 22 determine the Test Head destination or source for the MC Bus data signals. A program running in the Controller Module 22 performs read and write operations over the MC Bus path by executing read and write signals to special addresses that are not present in the RAM 61 of the Controller Module 22.

The MC Bus and Mother Board Interfaces 75 and 98 allow communication between the Stack Bus 102 and Ring Bus 103. Each Pin Electronics Card 105 has its own address on the Ring Bus 103, and control words from the Controller Module 22 permit individual communication with each Pin Electronics Card, or the transmission of common parameters to all Pin Electronics Cards 105 at the same time. In the preferred embodiment, PASCAL language is used by the Controller 22.

In general, each of the Pin Electronics Cards 105 has power available for performing certain of the test functions to be made on its associated Device 50 pin. Typically such power levels will be relatively low. In a preferred construction of the invention, the Pin Electronics Cards 105 are limited to supplying 0.5 amperes each. However, the Test Head Module 28 includes two or more auxiliary power supplies on the Auxiliary Power Supply card 97A, located on the Mother Board 82, each being capable of supplying the respective pin of the Device Under Test 50 with up to 1.5 amperes of DC power in the minus 10 volt to plus 10 volt range.

In the preferred embodiment, the DC voltage Reference Generator circuitry 96A provides precision reference voltages that are used for dynamic functional testing, AC parametric testing, and for setting the output voltage of the auxiliary power supply 97A.

As previously stated, most of the high-speed logic in the Test Head Module 28 is located on the Pin Electronics Cards 105, to shorten the drive and sense lines or signal flow paths, as much as possible. This reduces settling time and wave distortion, to provide faster and more accurate testing. Also, since there is one Pin Electronics Card 105 designated for each pin of the Device Under Test 50, a customer purchasing the Test System need only purchase as many Pin Electronics Cards 105 as there are pins to test on his Device Under Test 50.

Each Pin Electronics Card 105 contains: (1) a Precision Measurement Unit (PMU); and (2) a dynamic functional test circuit. The Precision Measurement Unit Circuits are operative to force and to measure DC voltages and currents. The PMU can also be used to provide output low current for terminating an output pin of a Device Under Test 50 during dynamic functional and AC parametric testing. The PMU circuit should preferably include a clamp circuit or other appropriate network to prevent the application of excessive voltages or currents to the Device Under Test 50. The individual PMU circuits allow true simultaneous tests of the Device 50 pins to be performed.

The primary function of the PMU DC parametric circuits on the Pin Electronics Card 105, is to force a current and to measure the resulting voltage, or conversely, to apply a voltage and to measure the resulting current in a pin of the Device Under Test 50. Typical DC parametric driver and measurement circuits that can readily be used on the Pin Electronics Card 105 are illustrated in block diagram form in FIGS. 8 and 9.

Figure 8:
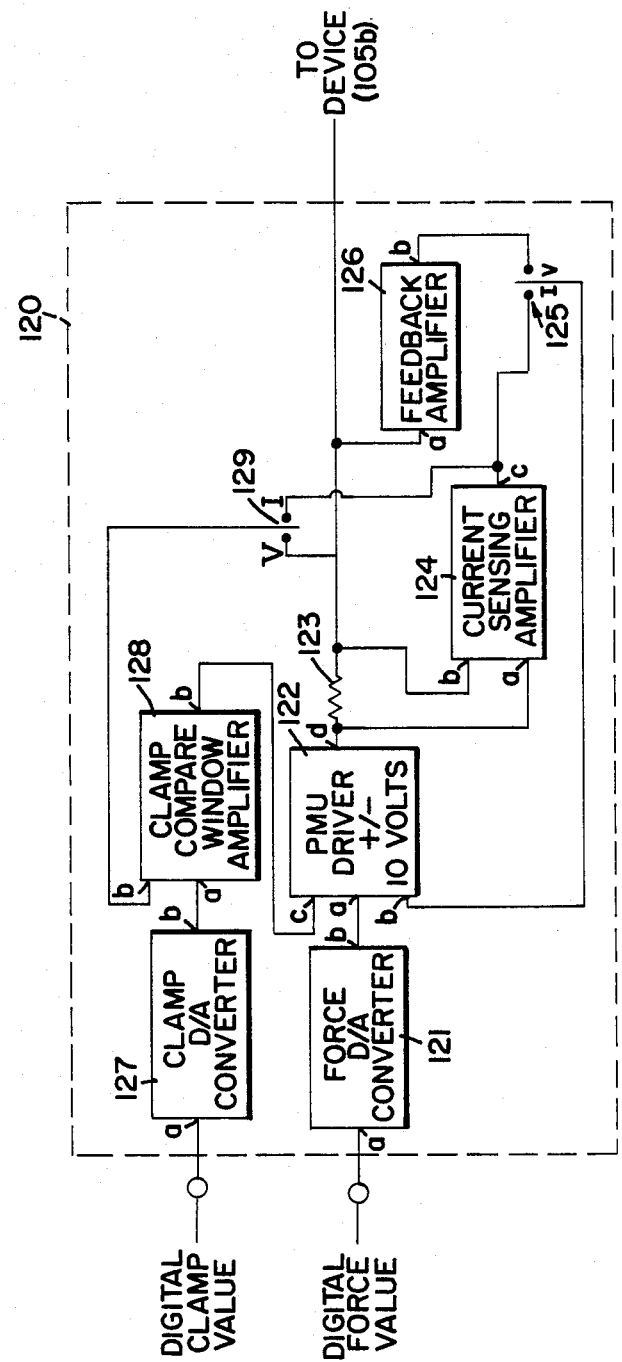
FIG. 8 is a block diagram representation illustrating the primary functional electrical networks of a typical DC Parametric Driver network of a Pin Electronics Card of the Test Unit Module, constructed according to a preferred embodiment of the invention.

Referring to FIG. 8, a DC Parametric Driver network 120 is illustrated in functional block diagram form. The DC Parametric Driver 120 has a first D/A Converter network 121, having an input terminal 121a and a signal output terminal 121b which is connected to a first input terminal 122a of a PMU Driver network 122. The Driver 122 further has second and third input terminals 122b and 122c respectively, and an output terminal 122d. The output terminal 122d of the PMU Driver 122 drives the associated pin of the Device Under Test 50 through a resistor 123. A Current Sensing Amplifier 124 has a pair of input terminals connected across the resistor 123 to sense the current flow therethrough. The signal output from the current sensing amplifier 124 is connected to a first side of a switch 125, labeled in the FIG. as "I" (representing "Current"). The switching element of the switch 125 is directly connected to the second input terminal 122b of the PMU Driver 122.

A feedback Amplifier 126 has its input 126a connected to sense the voltage of the signals being applied to the pin to the Device Under Test 50, and an output terminal 126b connected to the second side labeled as "V" (i.e. the "Voltage" side) of the switch 125.

A second D/A Converter 127 has an input terminal 127a connected to receive a digital clamp value, and a signal output terminal 127b directly connected to a first input terminal 128a of Clamp Compare Amplifier 128. The Amplifier 128 further has a second input terminal 128b which is connected to the switchable element of a second switch 129. The signal output from the Amplifier 128 is directly applied to the third input terminal 122c of the PMU Driver 122. The Switch 129 has a first stationary terminal directly connected to the output terminal of the DC Parametric Driver 120, and designated the "V" (i.e. "Voltage") side of the switch, and a second stationary contact directly connected to the output of the Current Sensing Amplifier 124, and designated as the "I" (i.e. "Current") side of the switch.

The DC Parametric Driver network 120 basically operates as follows. The desired digital value which is to be forced to the corresponding pin of the Device Under Test 50, is received by the D/A Converter 121 which converts the signal to an analog voltage, and applies the voltage signal to the first input terminal of the PMU Driver 122. The output signal from the PMU Driver 122 directly drives the pin of the Device Under Test 50. The second operative input terminal 122b of the PMU Driver 122 is connected to the signal output from the Current Sensing Amplifier 124 (if current is being forced), or to the signal output from the Feedback Amplifier 126 (if voltage is being forced) by means of the switch 125. The Current Amplifier 124 supplies a voltage that informs the PMU Driver when the proper output level at the output terminal of the Driver has been achieved. The Feedback Amplifier 126 provides three levels of gain to increase forcing and measuring accuracy of the Driver in low voltage ranges.

The second D/A Converter 127 receives the desired digital clamp value, converts it to an analog voltage level, and applies the voltage to the Clamp Compare Window Amplifier 128. The Amplifier 128 limits the output of the PMU Driver to a user-selected value or to the maximum current or voltage permitted by the presently-selected range, whichever is less.

Figure 9:
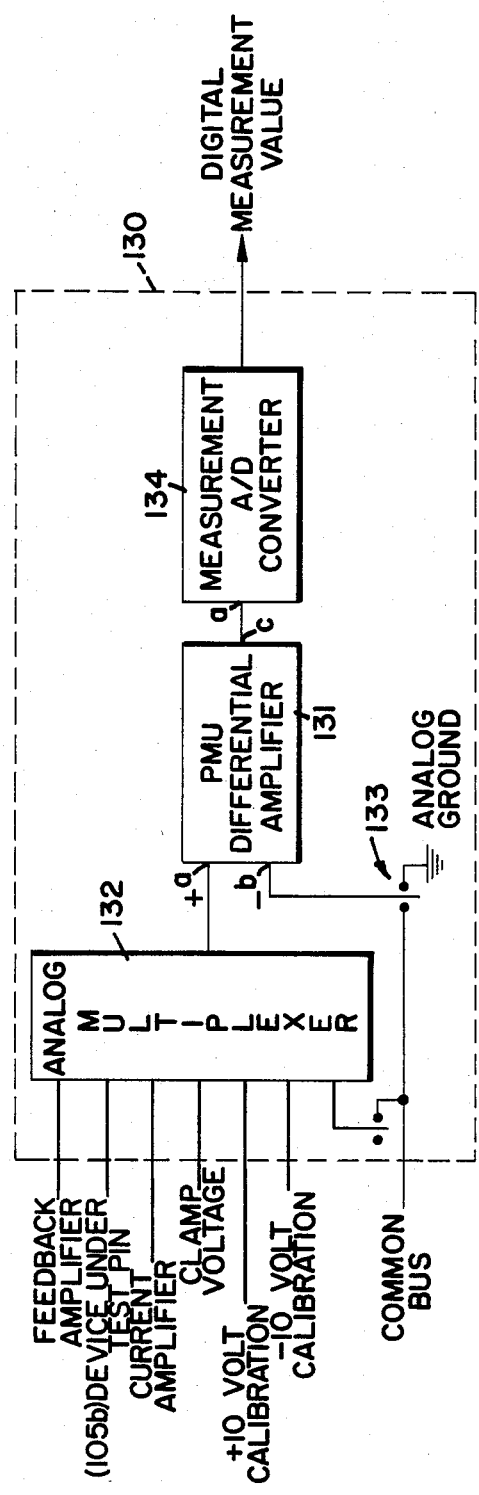
FIG. 9 is a block diagram representation illustrating the primary functional electrical networks of a typical DC Parametric Measurement network of a Pin Electronics Card of the Test Unit Module, constructed according to a preferred embodiment of the invention.

A DC Parametric Measurement network suitable for use on the Pin Electronics Cards 105 is illustrated at 130 in FIG. 9. The DC Measurement Circuit 139 contains a Differential Amplifier 131 having a positive input terminal 131a, a negative input terminal 131b and a signal output terminal 131c. The Differential Amplifier 131 samples a variety of voltage levels on the Pin Electronics Card 105 circuitry through an Analog Multiplexer 132 having a plurality of signal input terminals, and a signal output terminal that is directly connected to the positive input terminal of the Differential Amplifier 131. The voltages sampled by the Differential Amplifier 131 through the Multiplexer 132 include the Feedback Amplifier 126 output (from FIG. 8), the voltage level of the pin of the Device Under Test 50, the Current Sensing Amplifier 124 output (FIG. 8), the Clamp Voltage, plus 10 volt and minus 10 volt calibration voltages and the common bus line common to all of the Pin Electronics Cards 105. The negative input terminal 131b of the Differential Amplifier can be connected either to analog ground or to the common bus by means of the switch 133. The output signal from the Differential Amplifier 131 is applied directly to the input terminal 134a of an A/D Converter 134 which converts the voltage output from the Differential Amplifier 131 to a "digital" measurement value made available at the output terminal of the DC Parametric Measurement network 130.

The dedicated portions of the "dynamic functional test" circuits located on the Pin Electronics Cards 105 include, in the preferred embodiment, a 4K by 4-bit RAM, a Data Formatter, a Functional Pin Driver, a Programable Termination circuit, High-level and Low-level Precision AC Comparators, and an Error Check circuit. The Precision Comparators can also be connected to an AC Measurement Device for AC parametric testing. This circuit will be described in more detail below.

Figure 10:
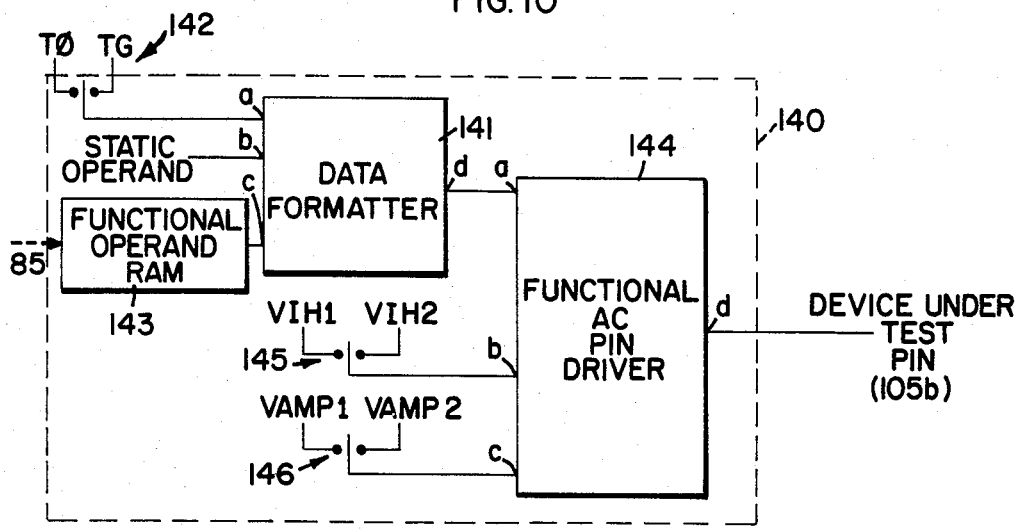
FIG. 10 is a block diagram representation illustrating the primary functional electrical of a typical AC/Dynamic Functional Driver network of a Pin Electronics Card of the Test Unit Module, constructed according to a preferred embodiment of the invention.
Figure 11:
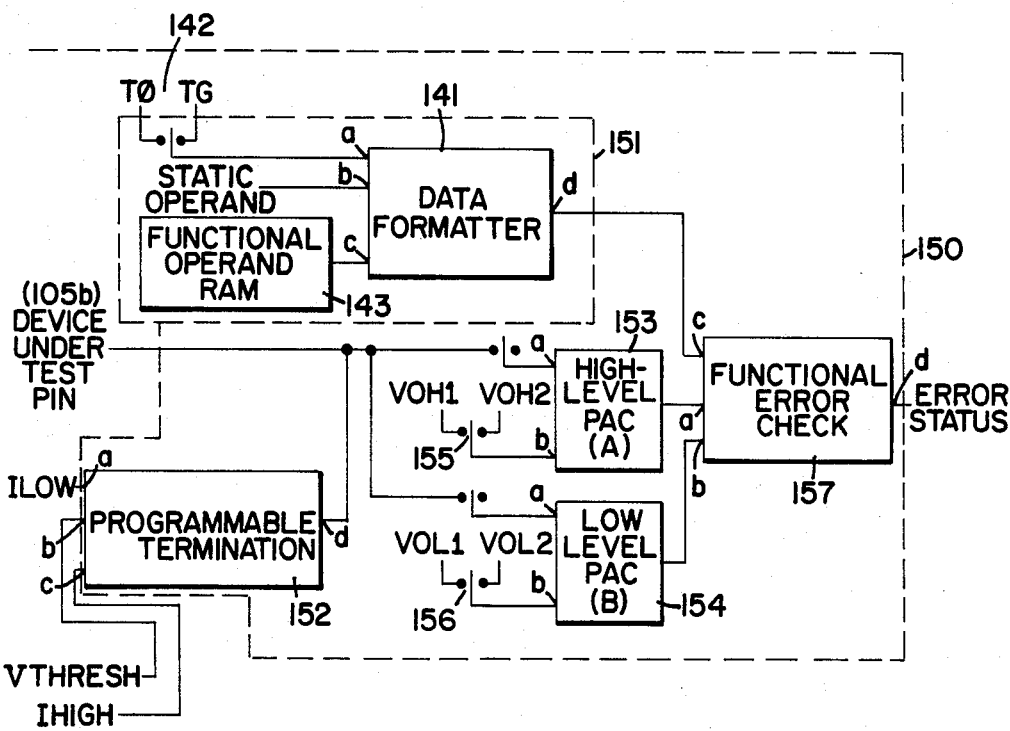
FIG. 11 is a block diagram representation illustrating the primary functional electrical networks a typical AC/Dynamic Functional Measurement network of a Pin Electronics Card of the Test Unit Module, constructed according to a preferred embodiment of the invention.

The dedicated Dynamic Functional Driver and Measurement circuits located on each of the Pin Electronics Cards 105 are respectively illustrated in functional block diagram form in FIGS. 10 and 11. These circuits are located on each Pin Electronics Card 105, and are used either to send a series of "high" and "low" signals to an "input" pin of the Device Under Test 50, or to determine whether the "high" and "low" signals from an "output" pin of the associated Device Under Test 50, occur at the proper time and have the required voltage levels.

Referring to FIG. 10, a Dynamic Functional Driver network 140 is illustrated. The Dynamic Driver Circuit 140 includes a Data Formatter network 141 having first, second and third input terminals 141a, 141b and 141c respectively, and a signal output terminal 141d. The first input terminal 141a of the Data Formatter 141 is connected to the switching element of a switch 142 used to select different timing signals from the Timing Generator circuit board 84 (See FIG. 7). The second input terminal 141b of the Data Formatter 141 is connected to receive a "static operand" signal. The third input terminal 141c of the Data Formatter 141 is connected to receive the output signal from a Functional Operand Random Access Memory 143. The Data Formatter 141 can generate a test series of "high" and "low" signals using a single static operand (via input terminal 141b), or by using operands from the Functional Operand RAM 143 (received at the input terminal 141c). The time base for operand generation can be either of the two available timing signals from the Timing Generator 84 (designated as TØ and TG respectively in FIG. 10). Control bits allow many different patterns to be generated using either static or dynamic operands.

The signal output from the Data Formatter 141 is applied to the signal input terminal 144a of a Functional AC Pin Driver network 144. The Driver 144 further has pair of reference input terminal 144b and 144c, and a signal output terminal 144d. Reference input terminal 144b is connected by means of a switch 145 to select two high input voltages designated as (VIH 1) and (VIH 2). The second reference input terminal 144c of the Driver 144 is connected by means of a switch 146 to select one of two amplitude voltages designated as (VAMP 1) and (VAMP 2). The Functional Pin Driver 144 converts the "high" and "low" signals from the Data Formatter 141 to logic values as specified by its reference inputs, and applies such voltages to the associated test pin of the Device Under Test. Having two sets of reference voltages available to the Functional Driver 144 permits "worst-case" testing and "nominal" testing to be performed back-to-back, without waiting for reference voltages to stabilize.

FIG. 11 illustrates, in functional block diagram form, a circuit configuration for a Dynamic Functional Measurement network 150, applicable to the Pin Electronics Cards 105. The Data Formatter 141 portion of the circuitry, generally designated within the dashed lines 151 for convenience, is identical to that circuitry previously described for such components within the Dynamic Functional Driver 140. The Dynamic Functional Measurement circuit 150 also includes a Programmable Termination Circuit 152 having three input terminals 152a, 152b and 152c respectively and an output terminal 152d. The first input terminal 152a is connected to receive a "low" current designated as ($I_{LOW}$). The second input terminal 152b is connected to receive a "threshold" voltage, designated as ($V_{THRES}$). The third input terminal 152c is connected to receive a "high" current signal, designated as ($I_{HIGH}$). The Programmable Termination circuit 152 is operable to selectively supply the $I_{LOW}$ or $I_{HIGH}$ current levels to the pin of the Device Under Test, whether it is an input or an output pin. In the preferred embodiment construction of the circuit, the $I_{LOW}$ current is provided from the PMU Driver 122 of the DC Parametric Driver Circuit 120 which is located on the same Pin Electronics Card 105 on which the Measurement Circuit 150 is located.

The Dynamic Functional Measurement circuit 150 has a pair of Precision AC Comparators, designated as a "high-level" precision AC Comparator 153, and a "low-level" Precision AC Comparator 154. The first input terminals 153a and 154a of the comparators 153 and 154 respectively are connected to sense the corresponding pin of the Device Under Test 50, as indicated in FIG. 11. The second input terminals 153b and 154b of the comparators 153 and 154 respectively are connected through switches 155 and 156 respectively to one of two respective "high" or "low" reference voltages. The output signals from the comparators 153 and 154 respectively are applied to first and second input terminals 157a and 157b respectively of a Functional Error Check network 157. The Error Check network 157 further has a third input terminal 157c and a signal output terminal 157d. The third input terminal 157c of the Error Check 157 is connected to receive the output signal from the Data Formatter Circuit 141. The Error Check circuit 157 determines whether the "high" and "low" signals from the respective pin being tested of the Device Under Test, agree with the "expected" values from the Data Formatter 141. The status of such comparison by the Error Check Circuit 157 is provided at the output terminal 157d of the Error Check circuit 157, which also forms the output signal of the Dynamic Functional Measurement circuit 150.

The Functional Pin Driver 144, the AC Comparators 153 and 154 and the Programmable Termination Circuit 152 all perform their functions under control of the reference voltage supplied by the DC Voltage Reference network 96A of the Test Head Module 28. All dynamic functional testing is performed under immediate control of the Functional Sequencer circuit board 88, which receives digital commands from the controller 22. The Functional Sequencer circuits 88 starts and stops tests, checks for error conditions, and provides test status.

Figure 12:
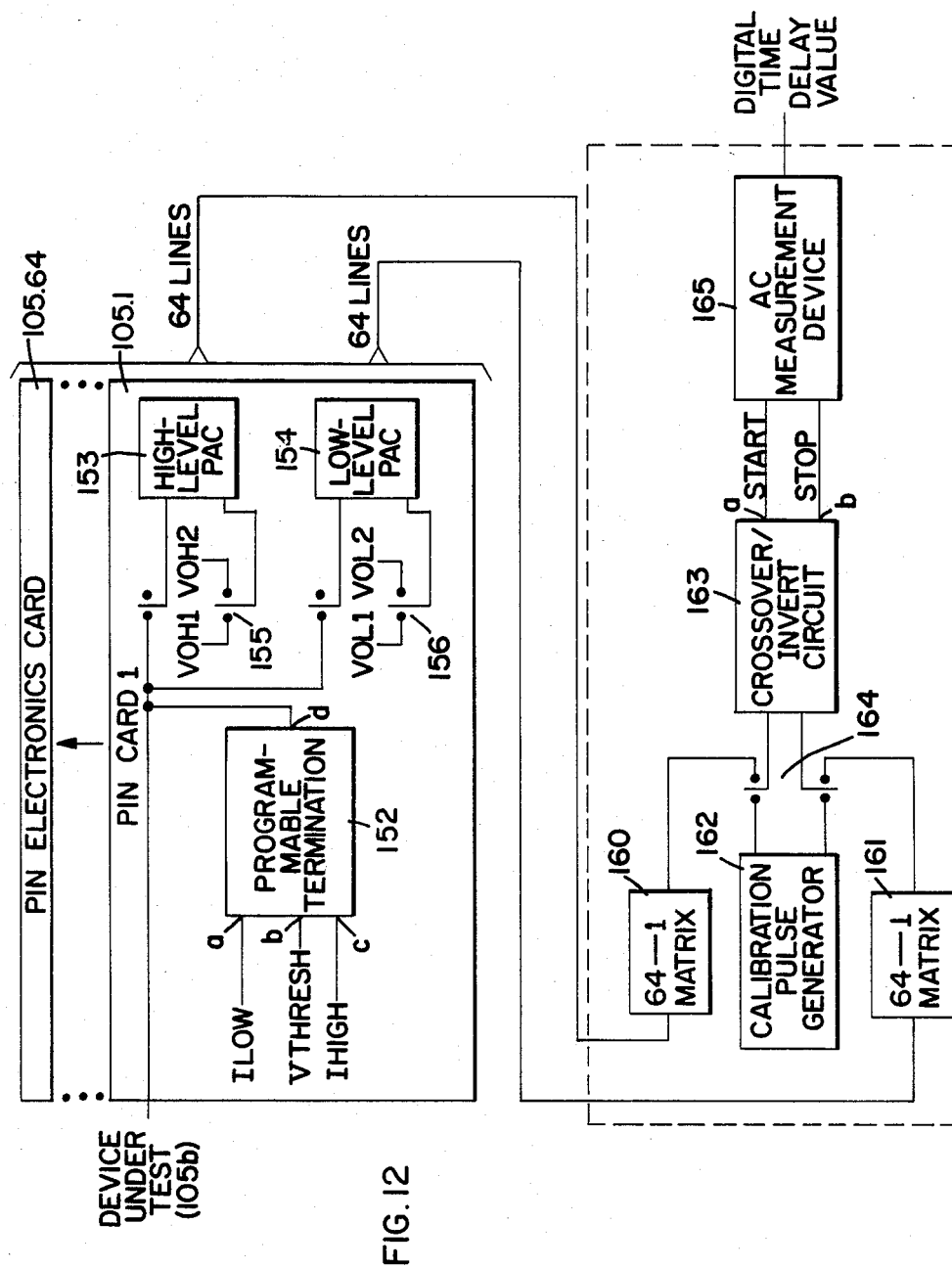
FIG. 12 is a block diagram representation illustrating the functional electrical networks of a typical AC Parametric Measurement Circuit for analyzing the AC response signals from the dynamic functional measurement circuits on each of the Pin Electrical Cards of FIG. 11, constructed according to a preferred embodiment of the invention.

A functional block diagram of an AC Parametric Measurement circuit which is applicable for use in the present invention is illustrated in FIG. 12. Referring thereto, dedicated circuitry from each of the plurality of Pin Electronics Cards that was used in part for forming the Dynamic Functional Measurement network 150 (i.e. the High and Low Level Precision AC Comparators 153 and 154 and the Programmable Termination Network 152) are used to form the AC Parametric Measurement network. In the preferred embodiment, 64 sets of such circuitry are used, corresponding to the 64 Pin Electronics Cards 105, in the system. In addition, two 64:1 matrixes identified as 160 and 161, respectively receive the four output signals from the 64 High-Level Comparators 153 and the 64 Low Level Comparators 154 respectively. The signal path between the output terminals of the matrixes 160 and 161 is interrupted by an Inverting Crossover Switch 163, which enables negative-going pulse edges to be used in the measurements, as well as positive-going pulse edges. A Precision Pulse Generator 162 can be switched into the circuit by means of the switch generally designated at 164 for calibration and deskew of the entire network. The Inverting Crossover network 163 has a pair of output terminals 163a and 163b which respectively carry the "Start" and "Stop" input signals, which are directly applied to the input terminals of an AC Measurement Device generally designated at 165. That circuitry enclosed within the dashed line 170 represents the common or shared AC test circuitry located on the circuit board 86.

In general, the AC Measurement Device 165 is a multiple sample time-differential digitizer that determines the time between positive-going edges applied to its start and stop inputs, respectively. There are generally two types of AC Parametric Testing that are performed by the AC Parametric Measurement Circuit: (1) determining the time delay between specified points on two waveform edges; and (2) determining the transition time between two points on the same edge. Reference voltages applied to the precision AC Comparators (153 and 154) specify the points on the waveform edges, and the crossover inverting switch 163 makes the comparator outputs compatible with the AC measurement device 165 inputs, according to the type of test being performed.

It will be understood that the various circuits and their respective interconnections that have been described above, are physically located on the Pin Electronics Cards 105, on the Mother Board 82 and on the underlying printed circuit boards 84, 86 and 88 (even though not illustrated in the Drawing), in manner appropriate to operatively effect the described circuitry. Layout of the circuitry as hereinbefore described, enables practically all of the wiring interconnections between the circuits on any of the printed circuit cards or boards, to be made by the use of conventional printed circuit paths. Such layout enables the circuit designer to accurately lay out and design the various interconnecting circuit paths, so as to equalize and match the response characteristics of critical interconnections, on the respective circuit boards to minimize skew problems between such paths. However, once such circuit paths and printed circuit boards have been designed, they can thereafter be batch-fabricated, completely eliminating the meticulous hand wiring and cutting/trimming operations that have heretofore been required in the art when assembling such integrated circuit test systems. Furthermore, the batch-fabrication design benefits provided by the architectural arrangement of this invention, enable consistent repeatability of signal flow path characteristics from system to system produced by the manufacturer, with minimal time being required for the assembly process.

As previously stated, one of the primary benefits of the architectural layout concept used by this invention, is the preservation of a "high-integrity" signal flow path from any of the critical test-signal producing circuits, to the Device Under Test 50. In the preferred construction, none of the test circuitry used for generating the critical-time-dependent signals used in the testing procedures, is physically located more than two to three feet (including the length of the printed circuit signal flow path lines on the printed circuit boards themselves) from the Device Under Test 50. As a matter of fact, since most of that circuitry which produces signals that are susceptible to degeneration when traveling over any distance of signal flow path, are physically located on the Pin Electronics Cards 105 themselves, most of such critical circuitry is located within a matter of "inches" of the Device Under Test 50. Such architectural configuration of the Test System completly eliminates the need for any signal integrity "restoring" equipment or circuits within the Test System for the "high-integrity" signals, since none of such high-integrity signals degrade to any extent in this system as they pass along the various signal flow paths of the system. Furthermore, as previously stated, none of the "high-integrity" signal paths of the Test System of this invention require the use of expensive coaxial cables to insure the integrity of the signals. Instead, relatively inexpensive printed circuit board conductor paths are employed.

In the preferred embodiment, the printed circuit boards used in the Test System are of a construction referred to in the industry as "stripline" construction, which enable signals carried by conductors on the board, to travel distances of two to five feet, in the higher frequency ranges before restoration of the carried signal is needed.

The architectural High Integrity Bus configuration of this invention, particularly applies to the transmission of AC and dynamic functional test signals of over 200 megahertz, and particularly to signals within the 0.5 to 2.0 gigahertz transmission bandwidth range. It is with signals falling within this range, that the signal flow transmission path length is of particular concern to the Test System manufacturer. The present invention enables the Test System manufacturer to transmit high-integrity test signals from the various circuit boards to the Device Under Test 50 in, for example, the 800 picosecond rise-time range with only a 10 to 20 percent increase in rise time over the signal flow path from the circuit producing the signal to the pin of the Device Under Test (and vise versa)—all by the use of inexpensive printed circuit board and standard connector apparatus. Maintenance of such high-integrity signal transmission is provided by the close proximity of the high-integrity signal producing circuitry to the Device Under Test, and by the high-integrity bus configuration used in this invention. In contrast, prior art test systems, that generated the high-integrity signals within the main frame test console which was remotely located from the test situs of the Device Under Test 50, required coaxial cables to transmit such signals and often times signal level restoring circuitry to maintain the integrity of the high-integrity signals during transmission over the signal flow paths.

In the preferred embodiment, four high frequency output pins or terminals are used (see FIG. 2) to carry signals between the Pin Electronics Cards 105 and the Device Under Test 50. It will be understood that any convenient number of such interconnections may be used within the scope of this invention. In the preferred embodiment, the four terminals (generally referred to at 105$b$ in FIG. 2), carry respectively: "a forced" test signal from the Pin Electronics Card 105 to the respective pin of the Device Under Test 50; a "sensed" or measurement signal from the respective pin of the Device Under Test 50 to the Pin Electronics Card 105; a ground or reference voltage; and a relay control signal for controlling contact manipulation circuitry on the Character Board or the Prober/Handler 34, to effect physical contact with the particular pin of the Device Under Test 50.

The four output terminals 105$b$ of the Pin Electronics Cards 105 are, in the preferred embodiment, spring-loaded and slightly retractable in the vertical direction (see FIG. 2), to provide a good physical and electrical contact with a plurality of contact pads (not illustrated) on the lower surface of a Character Board (generally referred to at 49 in FIG. 2). It will be noted that the Pin Electronics Card terminals 105$b$ are arranged to project through the circular opening in the top of the Test Head Module 28 chassis (see FIG. 2), to make contact to the contact pads of the Character Board 49. The Character Board 49 is only illustrated in block form in the Drawing, but is of a construction well-known in the art. The Character Board 49 merely provides a fan-out capability for the plurality of pins of the Device Under Test 50 which are to be tested, to the plurality of pads for mating with the terminals 105$b$ of the Pin Electronics Cards 105. Construction of such Character Boards 49 are well-known in the industry, and will not be belabored herein. The conductor paths of the Character Board 49 which lead from the paths which engage the terminals 105$b$ and to the respective pins of the Device Under Test 50, are, however, of a nature which do not significantly affect the integrity of the signals passing therealong, and thereby maintain the integrity of the signals.

The Handler or Prober 34 is operative to physically carry the Device Under Test 50 into testing proximity with the paths or terminals on the upper surface of the Character Board 49, and to operatively engage the respective pins of the Device Under Test 50 with such paths or terminals of the Character Board 49 so that signal transmission between the Test System 20 and the pins of the Device Under Test 50 can be effected, under control of the Central Processor 60.

In operation, the Prober/Handler 34 positions the Device 50 to be tested (whether such Device is a packaged integrated circuit, or one die of a waffer) into engagement with the operative contacts of the appropriate Character Board 49 for that Device. The Test Head Module 28 will have been previously configured to include at least one Pin Electronics Card 105 for each of the pins of the Device 50 which are to be tested. The layout pattern of the Character Board 49 is configured to operatively engage the terminals 105$b$ of the respective Pin Electronics Cards 105 and to carry signals to and from the terminals 105$b$ of the respective Cards 105 to the respective pins of the Device 50 with which such Cards 105 are associated.

In the preferred configuration of the Test System, the Controller 22 communicates with the Test Head 28 by performing read or write operations on nonexistent RAM addresses, that are monitored by the MC Bus Interface network 75. During a write operation, the MC Bus Interface network 75 decodes the address and directs the accompanying controller word to the proper Pin Electronics Card 105 or other element, such as to the Functional Sequencer Circuitry (Circuit Board 88), or Timing Generator Circuitry (Circuit Board 84). During a read operation, the MC Bus Interface circuitry 75 decodes the address to enable one of the Pin Electronics Cards 105, or another "functional" element or network to supply data to the MC Bus Interface 75 for transfer to the Controller 22. This communication method, generally referred to as "memory mapping", permits large arrays of test control and result information to be transferred rapidly between the Controller 22 and Test Head 28, with a minimum of programming effort.

The particular circuits which are arranged upon the Pin Electronics Cards 105, on the Mother Board 82 and on the functional circuit boards 84, 86 and 88 may be of any configuration suitable for performing the desired test functions to be executed by the Test System, and may include circuit configuration which in and of themselves contain patentable subject matter. Other than for the functional interrelationship of such circuitry with the architectural layout of the Test Head Module 28 as relative to the multiple-bus configuration described herein, and other than for the fact that the actual AC, DC and dynamic functional test circuitry for producing the high-integrity test signals is contained within the Test Head Module 28 itself, the details of such circuitry are not directly germane to this invention. It will be understood that one skilled in circuit design can implement such circuitry by any number of different circuit configurations which can perform the desired testing operations, within the scope of this invention. Accordingly, a detailed description of such circuitry and its exact nature of operation will not be described in detail herein, it being understood from the functional circuit descriptions herein provided, one skilled in the art of circuit design can readily implement such functional circuitry to achieve his desired test goals. Similarly, the particular manner in which the Controller Module 22 controls operation of the circuitry within the Test Head Module 28 through commands from the Central Processor 60 will not be detailed herein. It is understood that those skilled in the art can readily provide the necessary programming and processor control information necessary to implement the particular test program desired for the Test System, which accommodates the format requirements of the particular processor used. Similarly, the particular format of the "instruction" and "address" words that pass between the Controller Module 22 and the Test Head Module 28 are a matter of design choice, and can, within the scope of this invention, take on any number of possibilities, depending upon the particular controller system employed and the nature of the actual test circuits used with the Test Head Module 28.

As generally described in the description of the functional circuitry used in the preferred embodiment, the circuits of the Test System 20 are typically used to perform three types of testing on an integrated circuit: (1) DC Parametric Testing; (2) Dynamic Functional Testing; and (3) AC Parametric Testing however, the invention applies to a Test System that uses any one or any combination of the three types of tests. All of the high-integrity test signals are produced by circuits within the Test Head Module 28. The commands for activating the respective portions of such circuitry to execute the tests (i.e. addressing or selecting the various Pin Electronics Cards 105 for active signal generation), and for establishing the various parameters to be fed into and used by the respectively activated circuitry, is derived from the Controller (which may be remotely located, or form an integral part of the Test Head 28) 22 through the Multibus ® Bus 100/Stack Bus 102/Ring Bus 103 communication scheme. The AC and Dynamic Functional "high-integrity" test "stimulus/response" signals that are applied to and received from the Device Under Test 50, are carried with minimal degradation by the High-Integrity Bus 101.

As stated above, DC Parametric Testing includes either: forcing a voltage to a test pin of the Device Under Test 50 and measuring the resulting current; or forcing a current to the test pin of the Device Under Test 50 and measuring the resulting voltage. In the preferred embodiment, the actual PMU circuitry used for generating the test signals and measuring the response signals from the pin of the Device Under Test 50 are functionally illustrated in FIGS. 8 and 9 (one each of such circuits being present on each of the Pin Electronics Cards 105). By way of example only, the following description will illustrate (without specifically detailing the format and content of the computer instruction words) how the DC parametric testing circuits of FIGS. 8 and 9 operate under processor control to perform a test sequence wherein a voltage is forced to a test pin of the Device Under Test 50 and a resulting current is measured.

- A first controller instruction addresses the Pin Electronics Card 105 associated with that pin of the Device 50 which is to be tested, and functionally "connects" the DC Force/Measure Circuitry of FIGS. 8 and 9 of that Pin Electronics Card 105 of the selected pin of the Device 50.
- A second instruction from the Controller 22 "enables" the "force voltage mode". This instruction controls switches 125 and 129 (FIG. 8), respectively connecting the Feedback Amplifier 126 to the PMU Driver 122 and the Current Sensing Amplifier 124 to the Clamp Compare Window Amplifier 128 (i.e. switches 125 and 129 are switched to their "V" positions). This causes the PMU Driver 122 to adjust its output signal until the output of the Feedback Amplifier 126 matches the reference value from the Force D/A Convertor 121. If the output of the Current Sense Amplifier 124 exceeds the reference voltage from the Clamp D/A Convertor, the Clamp Compare Window Amplifier 128 prevents the PMU Driver 122 from raising its output voltage any further.
- A third instruction from the Controller 22 sets the desired current measurement range. The Currrent Sense Amplifier 124 measures current from the Device 50 test pin by determining the voltage drop across one of several known resistances. The current range select instruction specifies through which resistance the detected current from the Device 50 pin being monitored will pass. The resulting voltage is gated through the Analog Multiplexer 132 (FIG. 9) to the PMU Differential Amplifier 131.
- A fourth instruction from the Controller 22 sets the voltage value that is to be applied or "forced" to the Device 50 pin in the preferred embodiment, the voltage value is stored in a register on the Pin Electronics Card which is addressed by this instruction, and is applied on command of this instruction to the input of the Force D/A Convertor 121 (FIG. 8). The output of the Convertor 121 serves as a reference voltage to the PMU Driver 122.

The gain of Feedback Amplifier 126 is selected by a fifth instruction by the Controller 22. This instruction determines whether the gain supplied by Feedback Amplifier 126 is one of several values (in the preferred embodiment: 1, 2 or 4). As previously stated, the purpose of the Feedback Amplifier 126 is to increase the resolution of the force/measure circuit when working with relatively small voltages.

The desired clamp current value is selected by a sixth instruction from the Controller 22. As with the force voltage value, the clamp current value is addressable and stored in a register on the Pin Electronics Card 105, and when addressed by the Controller instruction, is applied as an input signal to the Clamp D/A Convertor 127. The output of Convertor 127 serves as a reference voltage to the Clamp Compare Window Amplifier 128.

The output of the Current Sensing Amplifier 124 is operatively connected to the PMU Differential Amplifier 131 through the Analog Multiplexer 132 (FIG. 9) by means of a seventh instruction from the Controller Module 22. This instruction determines that voltage value which is to be gated to the positive input 131a of the PMU Differential Amplifier 131. When the output of the Current Sensing Amplifier 124 is gated to the input 131a of the Amplifier 131, the Amplifier 131 measures a "current" value. The output of the Current Sensing Amplifier 124 is a voltage that corresponds to the amount of current being supplied to the Device 50 test pin.

The negative input terminal 131b of the PMU Differential Amplifier 131 is connected by an eighth instruction from the Control Module 22, to analog ground, by activation of the switch 133 to the analog ground position.

After the above "preparatory/set-up" steps have been performed, the Control Module 22 performs a "write" instruction to start the current measurement. This instruction energizes (i.e. "starts") the A/D Convertor 134 which generates and stores a digital value corresponding to the voltage received from the PMU Differential Amplifier 131.

The Control Module 22 then performs a "read" instruction to determine the current measurement value. This instruction effects a reading of the output of the A/D converter 134. The "value" at this address is a digital representation of the voltage at the output of the PMU Differential Amplifier 131. When voltage is being forced and current measured, as in this test, the voltage level at the output 131c of the Differential Amplifier 131 corresponds to the current being drawn by the Device 50 pin under test.

The above sequence illustrates how the PMU circuitry of FIGS. 8 and 9, located on the Pin Electronics Cards 105 can be controlled by the Controller Module 22 to execute the desired test on a selected pin of the Device Under Test 50. Besides power, the only signals passing back and forth between the Pin Electronics Card 105 and the Controller 22 are digital address, instruction and measurement result signals. The test signals themselves are generated on the dedicated Pin Electronics Card 105, and need travel only a short distance to the selected pin of the Device Under Test 50.

In similar manner, the same PMU Pin Electronics Card 105 circuitry of FIGS. 8 and 9 can be instructed by the Controller 22 to force a current to the selected pin of the Device 50 and to measure the resulting voltage. Such operation will not be detailed herein.

The "dynamic functional" and "AC parametric" testing functions will only be generally described herein, it being understood that those skilled in the art can readily implement any number of circuit configurations and operational modes for accomplishing these types of testing functions. In the preferred construction of the invention, the "dynamic functional" and "AC parametric" testing functions rely on three different signals from the "timing generator" circuitry located on circuit board 86 (FIG. 2). These signals include: a cycle time signal TO; a variable-width pulse that can be specified to occur anywhere in the cycle time TG; and a strobe pulse (approximately 5 nanoseconds in the preferred embodiment) that can be specified to occur anywhere in the cycle time. The Controller 22 generates timing control words which specify the desired waveforms for these signals.

The "dynamic functional" testing is oftentimes referred to as "clock rate", "node" or "truth table" testing, and basically includes those tests which verify whether a device is able to perform the function for which it is designed. The purpose of this testing is to propagate "high" and "low" signals through the Device 50, while verifying that actual outputs correspond to the expected output signals. The functional circuits illustrated in FIGS. 10 and 11 are generally used in the preferred embodiment to perform the "dynamic functional" drive and measurement functions respectively. As with the "AC and DC parametric" circuits, the "dynamic functional" circuits are entirely operable under instructions received from the Control 22.

In general, the dynamic functional circuitry operates in two modes, depending upon whether it is driving an input pin of the Device 50, or measuring an output signal from an "output" pin of the Device 50. When an input pin is being driven, the Data Formatter 131 (FIG. 10) supplies logic levels to the Functional Pin Driver 144, which generates corresponding "high" and "low" level voltages based on a "high-level" reference and an "amplitude" reference from the Reference Generator 96A (FIG. 7). All selections and data transfers involved are effected under control of the Controller 22.

When the signal output from an output pin of the Device 50 is being measured in a "dynamic functional test", the driver circuitry (FIG. 10) is turned off, the Programmable Termination network 152 or active termination for the pin is enabled (if required), the two Precision AC Comparators 153 and 154 are connected to the Device 50 pin and the Functional Error Check network 157 is energized to compare the Comparator (153 and 154) outputs with the Data Formatter 141 output to provide a pin error status.

In the preferred embodiment, all dynamic functional testing is performed under control of the circuitry previously referred to as the "functional sequencer" circuitry, physically located in the preferred embodiment on the printed circuit board 88 (FIG. 2). Control words for the functional sequencer circuitry originate in the Controller 22 and specify starting and stopping addresses in functional Random Access Memory 143, and other control functions. Additional control words return error counts, error operand addresses, and functional sequencer status information back to the Controller 22. The pattern of "highs" and "lows" generated by the Data Formatter 141 depends upon control word operands from the Controller 22 and upon 4-bit dynamic operands from the 4K by 4-bit functional RAM 143. A number of different types of "waveforms" can be made available through manipulation of the control words and functional operands, as desired for the particular test being performed.

A dynamic functional "driving" operation is simply described with reference to FIG. 10. The Functional Driver 144 has four inputs: a data input and an enable signal from the Data Formatter (applied to terminal 144a); a high-level voltage reference (applied to input 144b); an amplitude voltage reference (applied to input terminal 144c). Analog switches 145 and 146 permit either of two high-level references (VIH 1 or VIH 2) or either of two amplitude references (VAMP 1 or VAMP 2) to be connected to the functional driver 144. This permits rapid switching of the driver signal swing under program control. When it is enabled by and receives a "high" from the Data Formatter 141, the Functional Driver 144 raises its output to a level matching the selected high-level reference. Conversely, when it is enabled by and receives a "low" from the Data Formatter 141, the Functional Driver 144 lowers its output from the selected high-level reference by an amount equal to the selected amplitude reference. A set up the Functional Driver 144 for dynamic testing, it is necessary only to turn it on or off (under pattern generation control), to specify high-level and amplitude reference values using reference generator control words, and to select one of the two sets of reference voltages, using pin card control words.

FIG. 11 illustrates the circuits involved with a dynamic functional measurement test. When the output pin of the Device 50 which is being measured is of an open-emitter or open-collector type, the programmable termination circuit 152 provides the required termination voltage. The Data Formatter 141 supplies the expected logic values to the Error Check circuit 157, and the Precision Comparators 153 and 154 provide the actual values. The Error Check circuit 157 compares the "expected" and "actual" values to generate dynamic functional error status output signals. As with the Functional Pin Driver 144 circuitry, each of the Precision Comparators 153 and 154 has two reference voltages available to it. This permits testing a Device 50 output against one set of high and low references, switching the references rapidly under control, and then testing the output against the other set of references. The Data Formatter outputs depend upon the values provided for the control words as previously described with respect to "pattern generation".

AC parametric testing basically involves the measurement of time between occurrences of specified voltage levels on one or two waveforms. In the preferred embodiment, the AC parametric test system includes dedicated circuits on each Pin Electronics Card 105 connected to feed a single AC Measurement Device 165 (see FIG. 12), which is physically located in the preferred embodiment on the printed circuit board 86 (see FIG. 2). The AC Measurement Device 165 is connected to the plurality of Pin Electronics Cards 105 through a pair of 64:1 matrixes and a Crossover/inverter network 163. As previously stated, several of the circuits on the Pin Electronics Cards 105 used in the AC parametric testing are also used for DC parametric testing, as well as for dynamic functional testing. The AC Measurement Device 165 is a sampling-type unit requiring a fixed number of pulses to generate a measurement value. It has a "start" input and "stop" input each sensitive to only positive-going edges. The purpose of the Crossover/invertor network 163 is to modify and route pulses from the Precision Comparators 153 and 154 (whose outputs may be positive or negative) to the AC Measurement Device 165 in a manner such that all of the desired measurement tests may be performed. The AC parametric measurement circuit contains its own calibration pulse generator for injecting precision waveforms into the Crossover/invertor network 163.

The critical elements in AC parametric testing are connecting the Precision Comparators 153 and 154 to the proper pins of the Device Under Test 50, establishing the proper Precision Comparator reference voltages, and routing the Precision Comparator outputs through the Crossover/invertor network properly. Connection of the Precision Comparators 153 and 154 to the selected pins of the Device 50 depends upon the type of measurement being made. When measuring cycle time or edge transition time, both Precision Comparators on the same Pin Electronics Card 105 are connected to the same pin of the Device 50. When measuring the delay time between edges on two waveforms, one Precision Comparator on one Pin Electronics Card 105 is connected to the "input" pin of the Device 50, and one Precision Comparator on another Pin Electronics Card 105 is connected to the "output" pin of the Device 50.

Routing of the Precision Comparator output signal through the Crossover/invertor network requires knowledge of the Precision Comparator response to voltage levels at the respective pin of the Device 50. When the Device 50 pin is higher than the reference, the Precision Comparator output is high. Conversely, when the Device 50 pin is lower than the reference, the Precision Comparator output is low. Therefore, when the Device 50 pin drops through the reference level, the Precision Comparator generates a negative-going edge, and when the Device 50 pin climbs through the reference level, the Precision Comparator generates a positive-going edge. With knowledge of the significant edge from the Precision Comparator (i.e. the positive-going or the negative-going) and knowing that the AC Measurement Device is sensitive only positive-going edges permits the user to select the appropriate switches in the Crossover/invertor network 163 as previously stated.

As was the case with the dynamic functional circuitry, the AC measurement circuitry may comprise a number of different configurations. The above description has been provided only to illustrate one particular type of testing configuration applicable to such testing. It is important to note, however, that all of the circuitry required for generating the high-integrity signals for any of the above-described circuitry (i.e. whether DC parametric, AC parametric or dynamic functional), is generated within the Test Head Module 28 itself, and within an operatively short distance from the actual device being tested.

It will be understood that while individual circuit boards have been illustrated for holding the "common" circuitry associated with the timing, A.C. parametric testing and dynamic functional testing, that all of such circuitry could be placed on one board if desired. The benefit of placing such different "functional" circuitry on "separate" boards is that with the unique bussing connection method and architecture of this invention, changes to the circuitry of individual "functions" can readily be made by simply replacing entire circuit boards with those containing the new circuitry. Also, the "separate" circuit board technique allows rapid complete functional reconfiguration of an entire Test Head, simply by interchanging, replacing, subtracting from or adding to the boards within the Test Head. The same use-flexibility considerations apply to modification interchangeability of the Pin Electronics Cards. The simple printed inexpensive "connector" circuit board and bussing arrangement, in close proximity to the Device Under Test makes Test Systems built according to this invention extremely flexible to both the manufacturer and the user and enables the Test System to be rapidly updated to keep pace with state-of-the-art circuit and testing technology.

It will also be understood, that while the present invention has been described with a single Test Head under control of one or more Control Modules, that one Controller could just as well operate a plurality of Test Heads incorporating the principles of this invention.

From the foregoing description, it will be appreciated that the present invention solves many of the problems and deficiencies associated with prior art automated integrated circuit test systems. It will be understood that while the invention has been described with respect to particular examples of circuitry used for generating high-integrity test signals, that the invention is also applicable to other types of test circuitry. It will also be understood that while the invention has been described with regard to a particular orientation of circuit boards and connector patterns within the Test Head Module 28, that other configurations can equally be employed within the scope of this invention. Other modifications of the invention will be apparent to those skilled in the art in light of the foregoing description. This description is intended to provide specific examples of individual embodiments clearly disclosed in the present invention. Accordingly, the invention is not limited to the described embodiments, or to the use of specific elements therein. All alternative modifications and variations of the present invention which fall within the spirit and broad scope of the appended claims are covered.

What is claimed is:

1. An automated test apparatus for testing various parameters of multiple-terminal integrated circuit devices at a test station by communicating with the terminals of a device via high-integrity test signals, each involving communication with a single terminal of the device, and via shared function signals, involving communication with all terminals of the device, comprising:
   (a) A test head module, comprising:
      (i) a chassis, sized and configured for ease of placement and use at a test station, having a test port configured for placement in direct proximity to the terminals of an integrated circuit device to be tested;
      (ii) a plurality of discrete circuits mounted in said chassis proximate said test port, each of said circuits being responsive to received control signals and including means for generating and transmitting, and receiving high-integrity test signals communicated to and from, respectively, a corresponding terminal of the device at the test station to which said circuit is dedicated, each of said circuits being uniquely identifiable with, and having a signal output for, a different one of the terminals of the device;
      (iii) at least one common circuit electronically communicating with each of said discrete circuits, said at least one common circuit being responsive to received control signals and including means for generating and transmitting, and receiving shared function signals communicated to and from, respectively, all terminals of the device via said discrete circuits;
      (iv) means for operatively connecting said plurality of discrete circuits at said test port with said corresponding terminals of said integrated circuit device;
   (b) controller means for producing said control signals to selectively activate said discrete circuits and said at least one common circuit, said controller means being operable to produce said control signals in a manner enabling simultaneous activation of a plurality of said discrete circuits and said at least one common circuit; and
   (c) means operatively connecting said controller means with said plurality of discrete circuits and said at least one common circuit for carrying said control signals therebetween.

2. An automated test apparatus as recited in claim 1, wherein said controller means includes digital control circuit means for producing digital control signals; wherein said digital control signals comprise in part said control signals to which said discrete circuits are responsive.

3. An automated test apparatus as recited in claim 2, wherein said controller means includes a programmable central processor means for generating said digital control signals.

4. An automated test apparatus as recited in claim 2, wherein said controller means is remotely located from said test head module.

5. An automated test apparatus as recited in claim 4, wherein said means connecting said controller means with said plurality of discrete circuits include electrical conductor circuit paths other than coaxial cable-type of conductors.

6. An automated test apparatus as recited in claim 2, wherein said controller means includes a power supply means for producing power signals; and wherein said power signals comprise in part said control signals to which said discrete circuits are responsive.

7. An automated test apparatus as recited in claim 6, wherein said controller means is remotely located from said test head module.

8. An automated test apparatus as recited in claim 1, wherein said plurality of discrete circuits include a corresponding plurality of DC test stimulus circuit means for generating DC stimulus test signals at said signal output; one each of said DC test stimulus circuit means being uniquely identifiable with each of said integrated circuit device terminals on which DC testing is to be performed, for producing said DC stimulus test signal at that said signal output identifiably associated with its respective device terminal.

9. An automated test apparatus as recited in claim 8, wherein said plurality of discrete circuits are mounted on separate pin electronics circuit boards, with that dedicated circuitry uniquely identifiably associated with one of said integrated circuit device terminals being mounted on a pin electronics circuit board operatively independent of others of said pin electronics circuit boards, for producing said DC stimulus test signals.

10. An automated test apparatus as recited in claim 8, wherein said plurality of discrete circuits include a corresponding plurality of DC test response circuit means for receiving and processing DC response test signals at said signal outputs; one each of said DC test response circuit means being uniquely identifiable with one each of said integrated circuit device terminals on which DC testing is to be performed, for receiving said DC response test signal at that signal output identifiably associated with its respective device terminal.

11. An automated test apparatus as recited in claim 10, wherein said plurality of discrete circuits are mounted on separate pin electronics circuit boards, with that dedicated circuitry uniquely identifiably associated with one of said integrated circuit device terminals being mounted on a pin electronic circuit board operatively independent of others of said pin electronics circuit boards for respectively producing and receiving said DC stimulus and response test signals; whereby each pair of DC test stimulus circuit means and said DC test response circuit means on an associated pin electronics circuit board together comprise DC precision measurement circuitry for independently performing DC parametric testing of an associated terminal of said integrated circuit device.

12. An automated test apparatus as recited in claim 11, wherein said plurality of DC test response circuit means include means for generating digital measurement signals responsive to said received DC response test signals; and wherein said means operatively connecting said controller means with said plurality of discrete circuits includes means for carrying said digital measurement signals from said discrete circuits to said controller means.

13. An automated test apparatus as recited in claim 12, wherein said means operatively connecting said controller means with said plurality of discrete circuits for carrying said control signals and digital measurement signals therebetween, includes electrical conductor circuit paths comprising conductor forms other than coaxial cable-type of conductors.

14. An automated test apparatus as recited in claim 11, wherein said chassis includes a printed circuit mother board having a plurality of connector members suitable for operatively matably engaging and receiving said plurality of pin electronics circuit boards; and wherein said means for connecting the controller means with said plurality of discrete circuits includes bus means electrically interconnecting said plurality of connector members for operatively energizing said pin electronics circuit boards carried thereby; whereby said pin electronics circuit boards are independently rapidly detachably removable from said connectors.

15. An automated test apparatus as recited in claim 14, wherein said means for connecting said plurality of signal outputs of said discrete circuits with said associated device terminals include contact terminals projecting from said pin electronics circuit boards and operatively connected with said discrete circuits; and wherein said plurality of connector members for holding said pin electronics circuit boards are radially aligned on said mother board about a vertical axis, in a manner such that said pin electronics circuit boards held thereby project their respective said contact terminals in radially aligned manner in close proximity to one another at said test port.

16. An automated test apparatus as recited in claim 11, wherein said dedicated circuitry on each of said pin electronics circuit boards is separably digitally addressable; and wherein said control signals include digital address signals for addressing said respective pin electronics circuit boards.

17. An automated test apparatus as recited in claim 10, wherein said test head module further includes: AC test circuitry in said chassis responsive to said control signals from said controller means, for generating AC stimulus test signals for application to said integrated circuit device terminals and for receiving and processing AC response test signals received from said integrated circuit device terminals; means for operatively carrying said AC stimulus and response test signals between said integrated circuit device terminals and said AC test circuitry; and means operatively connecting said controller means with said AC test circuitry.

18. An automated test apparatus as recited in claim 17, wherein said AC stimulus and response signals comprise high-integrity signals having a transmission band width of greater than 200 megahertz.

19. An automated test apparatus as recited in claim 17, wherein said plurality of discrete circuits include a corresponding plurality of discrete AC test stimulus and response circuit means for generating in part said AC stimulus and response test signals; wherein said AC test circuitry further includes common AC circuit means operatively shared by said plurality of discrete AC test stimulus and response circuit means of said discrete circuits for producing in part said AC stimulus and response test signals; and wherein said chassis further includes high-integrety signal bus means operatively connecting said common AC circuit means with said discrete AC circuit means.

20. An automated test apparatus as recited in claim 19, wherein said high-integrity bus means comprises electrical conductor paths formed other than by the use of coaxial-type cables.

21. An automated test apparatus as recited in claim 19, wherein said plurality of discrete circuits are mounted on separate pin electronics circuit boards, with that dedicated circuitry uniquely identifiably associated with one of said integrated circuit device terminals being mounted on a pin electronics circuit board operatively independent of others of said pin electronics circuit boards for producing said AC stimulus and response test signals; wherein said common AC circuit means is mounted on an auxiliary circuit board; and wherein said high-integrity signal bus includes matable rapidly detachable connector pairs and printed circuit paths, interconnecting the discrete and common AC circuit means.

22. An automated test apparatus as recited in claim 19, wherein said chassis means includes stack bus means operatively connecting said controller means with said plurality of discrete AC circuit means and said common AC circuit means for carrying said control signals therebetween.

23. An automated test apparatus as recited in claim 19, wherein said test head module further includes dynamic functional test circuit means in said chassis, responsive to said control signals for producing functional stimulus test signals and for receiving functional response test signals for functionally testing said plurality of integrated circuit device terminals; wherein said high-integrity signal bus means is operatively connected with said dynamic functional test circuit means for transmission of said functional stimulus and response test signals; and wherein said means for carrying said control signals from said controller is also operatively connected to carry said control signals to said dynamic functional test circuit means.

24. An automated test apparatus as recited in claim 23, wherein said plurality of discrete circuits are mounted on separate pin electronics circuit boards, with that dedicated circuitry uniquely identifiably associated with one of said integrated circuit device terminals being mounted on a pin electronics circuit board operatively independent of others of said pin electronics circuit boards, for producing said AC test signals; wherein said common AC circuit means is mounted on a first auxiliary circuit board; wherein said dynamic functional test circuit means is mounted on a second auxiliary circuit board; and wherein said high-integrity signal bus includes matable rapidly detachable connector pairs and printed circuit paths interconnecting the dedicated pin electronics circuit boards with the circuitry of said first and second auxiliary circuit boards in a manner that maintains the integrity of high-integrity signals passing therealong while permitting rapid detachability and replacement of any of said circuit boards operatively connected by said high-integrity bus.

25. An automated test apparatus as recited in claim 1, wherein said plurality of discrete circuits include a corresponding plurality of discrete AC test stimulus circuit means for generating AC stimulus test signals at said signal outputs; one each of said discrete AC test circuit means being uniquely identifiable with a corresponding one of said integrated circuit device terminals on which AC testing is to be performed, for producing said AC stimulus test signal at that said signal output identifiably associated with its respective device terminal.

26. An automated test apparatus as recited in claim 25, wherein said plurality of discrete circuits are mounted on separate pin electronics circuit boards, with that dedicated circuitry uniquely identifiably associated with one of said integrated circuit device terminals being mounted on a pin electronics circuit board operatively independent of others of said pin electronics circuit boards, for producing said AC stimulus test signal.

27. An automated test apparatus as recited in claim 25, wherein said plurality of discrete circuits includes a corresponding plurality of AC test response circuit means for receiving and processing AC response test signals at said signal outputs; one each of said AC test response circuit means being uniquely identifiable with a corresponding one of said integrated circuit device terminals on which AC testing is to be performed, for receiving said AC response test signal at that said signal output identifiably associated with its respective device terminal.

28. An automated test apparatus as recited in claim 27, wherein said plurality of discrete circuits are mounted on separate pin electronics circuit boards, with that dedicated circuitry uniquely identifiably associated with one of said integrated circuit device terminals being mounted on a pin electronics circuit board operatively independent of others of said pin electronics circuit boards for respectively producing and receiving said AC stimulus and response test signals; wherein said test head module further includes common AC circuit means in said chassis mounted on an auxiliary circuit board for operative sharing by said plurality of discrete AC test stimulus and response circuit means on said pin electronics circuit boards; high-integrity signal bus means operatively connecting said common shared AC circuit means of said auxiliary circuit board with said discrete AC circuit means of said plurality of pin electronics circuit boards; and means operatively connecting said controller means with said common AC circuit means.

29. An automated test apparatus as recited in claim 28, wherein said high-integrity signal bus includes matable, rapidly detachable connector pairs and printed circuit paths.

30. An automated test apparatus as recited in claim 28, wherein the distance of any conductor path through said high-integrity signal bus, from any of said discrete or common AC circuit means to said integrated circuit device at said test port, is less than 5 feet.

31. An automated test apparatus as recited in claim 28, wherein the distance of any conductor path through said high-integrity signal bus, from any of said discrete or common AC test circuit means to said integrated circuit device at said test port, is less than 3 feet.

32. An automated test apparatus as recited in claim 1, wherein said plurality of discrete circuits include a corresponding plurality of discrete dynamic functional test circuit means for generating dynamic functional stimulus test signals at said signal outputs; when each of said dynamic functional tests stimulus circuit means being uniquely identifiable with each of said integrated circuit device terminals on which dynamic functional testing is to be performed, for producing said dynamic functional test stimulus test signal at that said signal output identifiably associated with its respective device terminal.

33. An automated test apparatus as recited in claim 32, wherein said plurality of discrete circuits are mounted on separate pin electronics circuit boards, with that dedicated circuitry uniquely identifiably associated with one of said integrated circuit device terminals being mounted on a pin electronics circuit board operatively independent of others of said pin electronics circuit boards, for producing said dynamic functional stimulus test signal.

34. An automated test apparatus as recited in claim 32, wherein said plurality of discrete circuits include a corresponding plurality of dynamic functional test response circuit means for receiving and processing dynamic functional response test signals at said signal outputs; one each of said dynamic functional test response circuit means being uniquely identifiable with one each of said integrated circuit device terminals on which AC testing is to be performed, for receiving said dynamic functional response test signal at that said signal output identifiably associated with its respective device terminal.

35. An automated test apparatus as recited in claim 34, wherein said plurality of discrete circuits are mounted on separate pin electronics circuit boards, with that dedicated circuitry uniquely identifiably associated with one of said integrated circuit device terminals being mounted on a pin electronics circuit board operatively independent of others of said pin electronics circuit boards for respectively producing and receiving said AC stimulus and response test signals; wherein said test head module further includes common dynamic functional circuit means in said chassis mounted on an auxiliary circuit board for operative sharing by said plurality of discrete dynamic functional test circuit means on said pin electronics circuit boards; high-integrity bus means operatively connecting said common shared dynamic functional circuit means of said auxiliary circuit board with said discrete dynamic functional circuit means of said plurality of pin electronics circuit boards; and means operatively connecting said controller means with said common dynamic functional circuit means.

36. An automated test apparatus as recited in claim 35, wherein said high-integrity signal bus includes matable, rapidly detachable connector pairs and printed circuit paths.

37. An automated test apparatus as recited in claim 35, wherein the distance of any conductor path through said high-integrity signal bus, from any of said discrete or common dynamic functional circuit means to said integrated circuit device at said test port, is less than 5 feet.

38. An automated test apparatus as recited in claim 35, wherein the distance of any conductor path through said high-integrity signal bus, from any of said discrete or common dynamic functional circuit means to said integrated circuit device at said test port is less than 3 feet.

39. An automated test apparatus as recited in claims 12, 17, 23, 27 or 34 wherein the volume of said test head module chassis is no larger than 3.5 cubic feet.

40. An automated test apparatus as recited in claim 1 wherein said plurality of discrete circuits include:
 (a) a corresponding plurality of DC test stimulus circuit means for generating DC stimulus test signals at said signal outputs; one each of said DC test stimulus circuit means being uniquely identifiable with each of said integrated circuit device terminals on which said DC testing is to be performed, for producing said DC stimulus test signal at that said signal output identifiably associated with its respective device terminal;
 (b) a corresponding plurality of AC test stimulus circuit means for generating AC stimulus test signals at said signal output; one each of said AC test stimulus circuit means being uniquely identifiable with each of said integrated circuit device terminals on which AC testing is to be performed, for producing said AC test stimulus test signal at that said signal output identifiably associated with its respective device terminal; and
 (c) a corresponding plurality of dynamic functional test circuit means for generating dynamic functional stimulus test signals at said signal outputs; one each of said dynamic functional tests stimulus circuit means being uniquely identifiable with each of said integrated circuit device terminals on which dynamic functional testing is to be performed, for producing said dynamic functional test stimulus signal at that said signal output identifiably associated with its respective device terminal;
 (d) each of said discrete circuits comprising one of said plurality of DC test stimulus circuit means, one of said plurality of AC test stimulus circuit means, and one of said plurality of dynamic functional test circuit means.

41. An automated test apparatus as recited in claim 40 wherein each of said plurality of discrete circuits includes one of each of said plurality of DC test stimulus circuit means, one of each of said plurality of AC test stimulus circuit means, and one of each of said plurality of dynamic functional test circuit means, and wherein each of said discrete circuits comprises a discrete circuit board.

42. An automated test apparatus as recited in claim 41 further comprising a common printed circuit board and means for transmitting said control signals from said controller means to said common circuit board, and wherein said common circuit board and said discrete circuit boards define planes, the planes defined by said discrete circuit boards being generally perpendicular to the plane defined by said common printed circuit board.

43. An automated test apparatus as recited in claim 42 further comprising means for electronically communicating between said common circuit board and each of said discrete circuit boards.

* * * * *